(12) United States Patent
Hikosaka et al.

(10) Patent No.: US 8,829,544 B2
(45) Date of Patent: Sep. 9, 2014

(54) SEMICONDUCTOR LIGHT EMITTING DEVICE, NITRIDE SEMICONDUCTOR LAYER, AND METHOD FOR FORMING NITRIDE SEMICONDUCTOR LAYER

(75) Inventors: Toshiki Hikosaka, Kanagawa-ken (JP); Yoshiyuki Harada, Tokyo (JP); Maki Sugai, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 115 days.

(21) Appl. No.: 13/406,770

(22) Filed: Feb. 28, 2012

(65) Prior Publication Data

US 2012/0298952 A1    Nov. 29, 2012

(30) Foreign Application Priority Data

May 24, 2011    (JP) ................ 2011-115584

(51) Int. Cl.
 *H01L 33/32* (2010.01)
 *H01L 33/20* (2010.01)
 *H01L 33/12* (2010.01)

(52) U.S. Cl.
 CPC ............ *H01L 33/32* (2013.01); *H01L 33/20* (2013.01); *H01L 33/12* (2013.01)
 USPC ......... 257/94; 257/79; 257/103; 257/E33.027

(58) Field of Classification Search
 USPC ............................ 257/79, 94, 103, E33.027
 See application file for complete search history.

(56) References Cited

U.S. PATENT DOCUMENTS

2006/0099781 A1* 5/2006 Beaumont et al. ............ 438/509

FOREIGN PATENT DOCUMENTS

| CN | 1678771 A | 10/2005 |
|---|---|---|
| CN | 1848452 A | 10/2006 |
| JP | 2002-164296 A | 6/2002 |
| JP | 2004-96021 A | 3/2004 |
| JP | 2006-232640 A | 9/2006 |
| JP | 2007-12809 A | 1/2007 |
| JP | 2009-49179 | 3/2009 |
| WO | WO 02/090968 A1 | 11/2002 |

OTHER PUBLICATIONS

Office Action issued Jan. 11, 2013 in Korean Patent Application No. 10-2012-20552 (with English translation).
Office Action (with English translation) issued on Apr. 2, 2014, in counterpart Japanese Appln No. 2011-115584 (8 pages).
Office Action issued Jun. 4, 2014, in Chinese Patent Application No. 201210048490.3, (with English-language Translation).

* cited by examiner

*Primary Examiner* — Minchul Yang
(74) *Attorney, Agent, or Firm* — Oblon, Spivak, McClelland, Maier & Neustadt, L.L.P.

(57) ABSTRACT

According to an embodiment, a semiconductor light emitting device includes a foundation layer, a first semiconductor layer, a light emitting layer, and a second semiconductor layer. The foundation layer has an unevenness having recesses, side portions, and protrusions. A first major surface of the foundation layer has an overlay-region. The foundation layer has a plurality of dislocations including first dislocations whose one ends reaching the recess and second dislocations whose one ends reaching the protrusion. A proportion of a number of the second dislocations reaching the first major surface to a number of all of the second dislocations is smaller than a proportion of a number of the first dislocations reaching the first major surface to a number of all of the first dislocations. A number of the dislocations reaching the overlay-region of the first major surface is smaller than a number of all of the first dislocations.

18 Claims, 15 Drawing Sheets

US 8,829,544 B2

SEMICONDUCTOR LIGHT EMITTING DEVICE, NITRIDE SEMICONDUCTOR LAYER, AND METHOD FOR FORMING NITRIDE SEMICONDUCTOR LAYER

CROSS-REFERENCE TO RELATED APPLICATIONS

This application is based upon and claims the benefit of priority from the prior Japanese Patent Application No. 2011-115584, filed on May 24, 2011; the entire contents of which are incorporated herein by reference.

FIELD

Embodiments described herein relate generally to a semiconductor light emitting device, a nitride semiconductor layer, and a method for forming the nitride semiconductor layer.

BACKGROUND

Semiconductor light emitting devices such as ultraviolet, blue, or green light emitting diodes (LEDs) and bluish-violet or blue laser diodes (LDs) that use nitride semiconductors such as gallium nitride and the like have been developed.

It is desirable to increase the external quantum efficiency to increase the luminous efficiency of nitride semiconductor light emitting devices. To increase the external quantum efficiency, it is desirable to reduce dislocations that pierce the nitride semiconductor layer while reducing the pit density and obtaining high flatness.

DETAILED DESCRIPTION

Figure 1A:
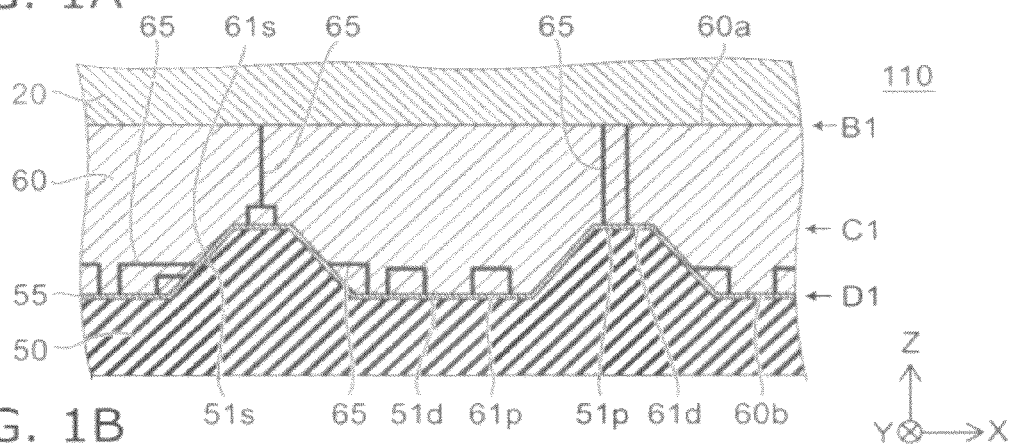
FIG. 1A to FIG. 1D are schematic views illustrating a semiconductor light emitting device according to a first embodiment.

According to one embodiment, a semiconductor light emitting device includes: a foundation layer having a first major surface and a second major surface on a side opposite to the first major surface, the foundation layer including a nitride semiconductor; a first semiconductor layer of a first conductivity type including a nitride semiconductor, the first semiconductor layer being stacked with the foundation layer along a stacking direction; a light emitting layer provided between the foundation layer and the first semiconductor layer, the light emitting layer including a nitride semiconductor; and a second semiconductor layer of a second conductivity type provided between the foundation layer and the light emitting layer, the second conductivity type being different from the first conductivity type, the second semiconductor layer including a nitride semiconductor. The first major surface faces the second semiconductor layer. The foundation layer has an unevenness provided on the second major surface, and the unevenness has a recess, a side portion, and a protrusion. The first major surface has an overlay-region which overlays the recess when viewed along the stacking direction. The foundation layer has a plurality of dislocations, and the dislocations include first dislocations whose one ends reaching the recess and second dislocations whose one ends reaching the protrusion. An another end of at least one of the second dislocations reaches the side portion without reaching the first major surface. A proportion of a number of the second dislocations reaching the first major surface to a number of all of the second dislocations is smaller than a proportion of a number of the first dislocations reaching the first major surface to a number of all of the first dislocations. A number of the dislocations reaching the overlay-region of the first major surface are smaller than a number of all of the first dislocations.

According to another embodiment, a nitride semiconductor layer has a first major surface, a second major surface on a side opposite to the first major surface, and an unevenness provided on the second major surface. At least one of dislocations which reach a protrusion of the unevenness with one end thereof reaches a side portion of the unevenness with another end thereof without reaching the first major surface. A proportion of a number of dislocations which reach the first major surface with one ends thereof and reach the protrusion with another ends thereof to a number of all of the dislocations which reach the protrusion is smaller than a proportion of a number of dislocations which reach the first major surface with one ends thereof and reach a recess of the unevenness to a number of all of the dislocations which reach the recess. A number of the dislocations which reach a region of the first major surface overlaying the recess when viewed along a stacking direction from the second major surface toward the first major surface is smaller than a number of the dislocations which reach the recess.

According to another embodiment, a method for forming a nitride semiconductor layer includes forming a first layer including a nitride semiconductor on a major surface of a substrate using a group III source material and a group V source material, the major surface of the substrate having a substrate protrusion, a substrate recess, and a substrate side portion; and forming a second layer including a nitride semiconductor on the first layer using the group III source material and the group V source material. A proportion of a supply amount of the group V source material to a supply amount of the group III source material in the forming of the first layer is less than a proportion of a supply amount of the group V source material to a supply amount of the group III source material in the forming the second layer. The forming the first layer includes causing at least one of dislocations occurring from the substrate recess in the first layer to reach the substrate side portion. The forming the second layer includes planarizing an unevenness formed in a surface of the first layer by filling the second layer into the unevenness.

Various embodiments will be described hereinafter with reference to the accompanying drawings.

The drawings are schematic or conceptual; and the relationships between the thicknesses and the widths of portions, the proportions of sizes among portions, and the like are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1A to FIG. 1D are schematic views illustrating the configuration of a semiconductor light emitting device according to a first embodiment.

Figure 2:
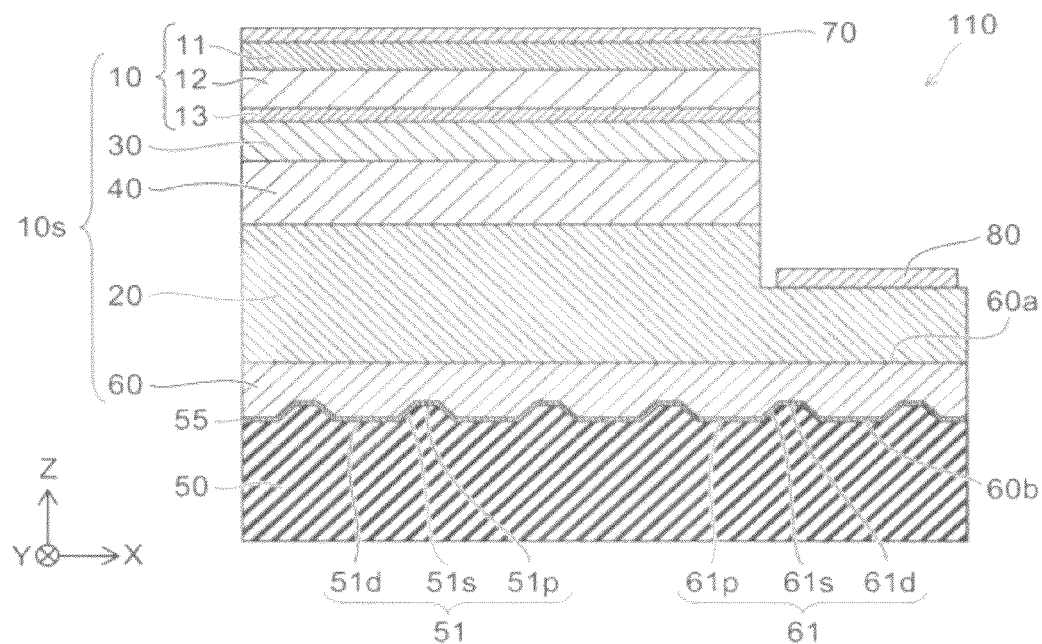
FIG. 2 is a schematic cross-sectional view illustrating the semiconductor light emitting device according to the first embodiment.

FIG. 2 is a schematic cross-sectional view illustrating the configuration of the semiconductor light emitting device according to the first embodiment. First, an overview of the configuration of the semiconductor light emitting device according to the embodiment will be described using FIG. 2.

As illustrated in FIG. 2, the semiconductor light emitting device 110 according to the embodiment includes a foundation layer 60, a first semiconductor layer 10, a light emitting layer 30, and a second semiconductor layer 20.

The foundation layer 60 includes a nitride semiconductor. The foundation layer 60 has an impurity concentration lower than that of the first semiconductor layer 10 or is an undoped layer. The first semiconductor layer 10 includes a nitride semiconductor and has a first conductivity type. The light emitting layer 30 is provided between the foundation layer 60 and the first semiconductor layer 10. The light emitting layer 30 includes a nitride semiconductor. The second semiconductor layer 20 is provided between the foundation layer 60 and the light emitting layer 30. The second semiconductor layer 20 includes a nitride semiconductor and has a second conductivity type. The second conductivity type is different from the first conductivity type. The impurity concentration in the foundation layer 60 is lower than an impurity concentration in the second semiconductor layer.

For example, the first conductivity type is a p-type; and the second conductivity type is an n-type. However, the embodiment is not limited thereto. The first conductivity type may be the n-type; and the second conductivity type may be the p-type. The case will now be described where the first conductivity type is the p-type and the second conductivity type is the n-type.

Herein, a direction from the foundation layer 60 toward the first semiconductor layer 10 is taken as a Z-axis direction.

One axis perpendicular to the Z-axis is taken as an X axis. A direction perpendicular to the Z-axis and the X-axis is taken as a Y-axis. The Z-axis is parallel to the stacking direction of a stacked structural body 10s that includes the foundation layer 60, the second semiconductor layer 20, the light emitting layer 30, and the first semiconductor layer 10.

In the specification of the application, stacking includes not only the case of being overlaid in direct contact but also the case of being overlaid with another component inserted therebetween.

In this example, the semiconductor light emitting device 110 further includes a multilayered structural body 40. Namely, the stacked structural body 10s further includes the multilayered structural body 40. The multilayered structural body 40 is provided between the second semiconductor layer 20 and the light emitting layer 30. The multilayered structural body 40 is, for example, a superlattice layer. The multilayered structural body 40 is, for example, the n-type. The multilayered structural body 40 may be provided if necessary and may be omitted. The multilayered structural body 40 may be considered to be included in the second semiconductor layer 20.

The second semiconductor layer 20 functions as, for example, an n-side contact layer. The second semiconductor layer 20 may include, for example, an n-type GaN layer.

In this example, the first semiconductor layer 10 includes a first p-side layer 11, a second p-side layer 12, and a third p-side layer 13. The light emitting layer 30 is provided between the first p-side layer 11 and the second semiconductor layer 20 (in this example, between the first p-side layer 11 and the multilayered structural body 40). The second p-side layer 12 is provided between the first p-side layer 11 and the light emitting layer 30. The third p-side layer 13 is provided between the second p-side layer 12 and the light emitting layer 30. The first p-side layer 11 functions as, for example, a p-side contact layer. The first p-side layer 11 may include, for example, a p-type GaN layer. The second p-side layer 12 may include, for example, a p-type GaN layer. The third p-side layer 13 may include, for example, a p-type AlGaN layer.

Examples of the light emitting layer 30 and the multilayered structural body 40 are described below.

The foundation layer 60 has a first major surface 60a and a second major surface 60b. The first major surface 60a is the major surface on the second semiconductor layer 20 side. The second major surface 60b is the major surface on the side opposite to the first major surface 60a. The first major surface 60a faces the second semiconductor layer 20. For example, the second major surface 60b is the lower surface; and the first major surface 60a is the upper surface. Or, for example, the second major surface 60b may be the upper surface; and the first major surface 60a may be the lower surface.

The direction from the second major surface 60b toward the first major surface 60a is parallel to the stacking direction (the Z-axis direction).

The foundation layer 60 has an unevenness 61. The unevenness 61 is provided on the second major surface 60b of the foundation layer 60. The unevenness 61 has a recess 61d, a side portion 61s, and a protrusion 61p. The recess 61d is a portion that is relatively more receded than is the protrusion 61p. The protrusion 61p is a portion that protrudes relatively more than does the recess 61d. The side portion 61s is a portion between the recess 61d and the protrusion 61p.

In this example, the semiconductor light emitting device 110 further includes a substrate 50, a buffer layer 55, a first electrode 70, and a second electrode 80.

The foundation layer 60 is disposed between the substrate 50 and the second semiconductor layer 20. In other words, the substrate 50 is provided to face the second major surface 60b of the foundation layer 60. The substrate 50 may include, for example, sapphire, silicon carbide (SiC), a silicon (Si) substrate, gallium arsenide (GaAs), a GaN substrate, an AlN substrate, and the like. The buffer layer 55 is provided between the substrate 50 and the foundation layer 60.

An unevenness (a substrate unevenness 51) is provided on the major surface of the substrate 50. The buffer layer 55 is provided on the major surface of the substrate 50. The foundation layer 60 is provided on the buffer layer 55. The unevenness 61 of the foundation layer 60 is formed by the substrate unevenness 51 being provided in the substrate 50. For example, the substrate unevenness 51 of the substrate 50 has a substrate protrusion 51p, a substrate side portion 51s, and a substrate recess 51d. The substrate protrusion 51p faces the recess 61d of the foundation layer 60 along the Z-axis. The substrate recess 51d faces the protrusion 61p of the foundation layer 60 along the Z-axis. The substrate side portion 51s faces the side portion 61s of the foundation layer 60.

The stacked structural body 10s recited above is formed on the buffer layer 55 that is formed on the substrate 50. The substrate 50 may be separated after the stacked structural body 10s is formed. The buffer layer 55 may be removed when separating the substrate 50. At least a portion of the buffer layer 55 may remain after separating the substrate 50. The buffer layer 55 may be provided if necessary and may be omitted in some cases.

The first electrode 70 is electrically connected to the first semiconductor layer 10. The second electrode 80 is electrically connected to the second semiconductor layer 20. In this example, the light emitting layer 30 is provided between the first semiconductor layer 10 and a portion of the second semiconductor layer 20. The second electrode 80 is provided on a portion of the second semiconductor layer 20 of the major surface of the stacked structural body 10s on the first semiconductor layer 10 side.

Light is emitted from the light emitting layer 30 by a current flowing in the light emitting layer 30 via the first semiconductor layer 10 and the second semiconductor layer 20 by applying a voltage between the first electrode 70 and the second electrode 80. The semiconductor light emitting device 110 is, for example, an LED.

An example of the configuration of the light emitting layer 30 will now be described.

Figure 3:
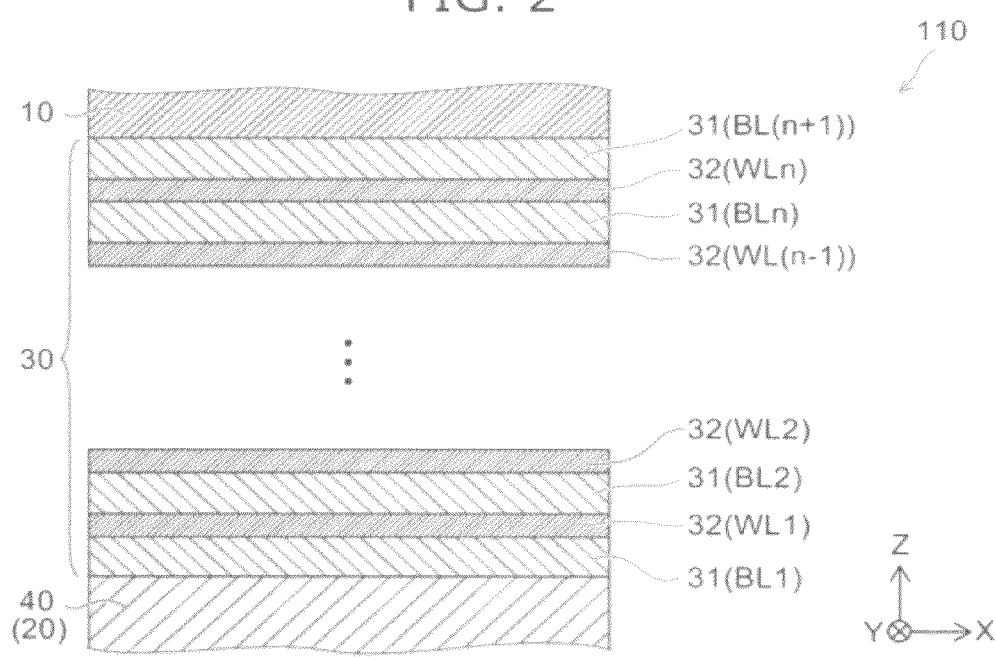
FIG. 3 is a schematic cross-sectional view illustrating a portion of the semiconductor light emitting device according to the first embodiment.

FIG. 3 is a schematic cross-sectional view illustrating the configuration of a portion of the semiconductor light emitting device according to the first embodiment.

As illustrated in FIG. 3, the light emitting layer 30 includes multiple barrier layers 31 and a well layer 32 provided between the multiple barrier layers 31.

For example, the light emitting layer 30 may have a single quantum well (SQW) structure. In such a case, the light emitting layer 30 includes two barrier layers 31 and the well layer 32 provided between the barrier layers 31. For example, the light emitting layer 30 may have a multiple quantum well (MQW) structure. In such a case, the light emitting layer 30 includes three or more barrier layers 31 and well layers 32 provided between the barrier layers 31.

In the example illustrated in FIG. 3, the light emitting layer 30 includes n+1 barrier layers 31 and n well layers 32 (where n is an integer not less than 1). The (i+1)th barrier layer BL(i+1) is disposed between the second semiconductor layer 20 and the ith barrier layer BLi (where i is an integer not less than 1 and not more than n−1). The (i+1)th well layer WL(i+1) is disposed between the ith well layer WLi and the first semiconductor layer 10. The 1st barrier layer BL1 is provided between the second semiconductor layer 20 (in this example, the multilayered structural body 40) and the 1st well layer WL1. The nth well layer WLn is provided between the nth barrier layer BLn and the (n+1)th barrier layer BL(n+1). The (n+1)th barrier layer BL(n+1) is provided between the nth well layer WLn and the first semiconductor layer 10.

The well layer 32 includes a nitride semiconductor that includes a group III element and a group V element. For example, the well layer 32 includes a nitride semiconductor that includes indium (In) and gallium (Ga). In other words, the well layer 32 includes, for example, $In_{xs}Ga_{1-xs}N$ ($0.05 \leq xs \leq 0.5$). The peak wavelength of the light emitted from the light emitting layer 30 is, for example, not less than 400 nanometers (nm) and not more than 650 nm.

The barrier layer 31 includes a nitride semiconductor that includes a group III element and a group V element. The bandgap energy of the barrier layer 31 is larger than the bandgap energy of the well layer 32.

In the case where the barrier layer 31 includes In, the compositional proportion of In in the group III element of the barrier layer 31 is lower than the compositional proportion of In (the In compositional proportion xs recited above) in the group III element of the well layer 32. Thereby, the bandgap energy of the well layer 32 is smaller than the bandgap energy of the barrier layer 31.

The multilayered structural body 40 includes multiple first structural body films (not illustrated) stacked along the Z-axis and second structural body films provided between the first structural body films. In other words, the multilayered structural body 40 includes the multiple first structural body films and the multiple second structural body films stacked alternately in the Z-axis direction. The first structural body film includes, for example, GaN; and the second structural body film includes, for example, InGaN.

Figure 4A:
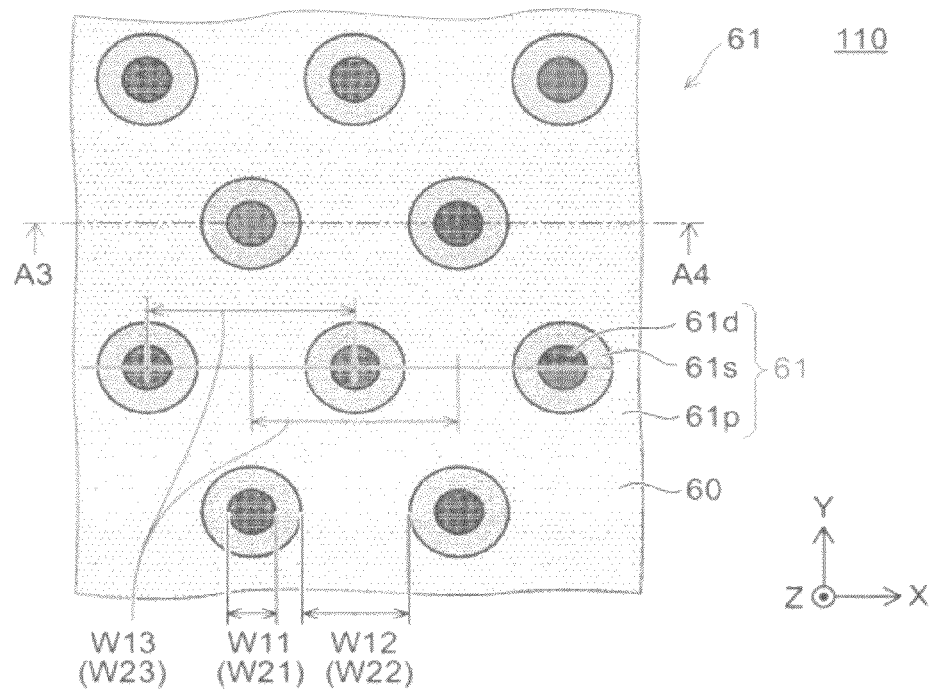
FIG. 4A and FIG. 4B are schematic views illustrating a portion of the semiconductor light emitting device according to the first embodiment.
Figure 4B:
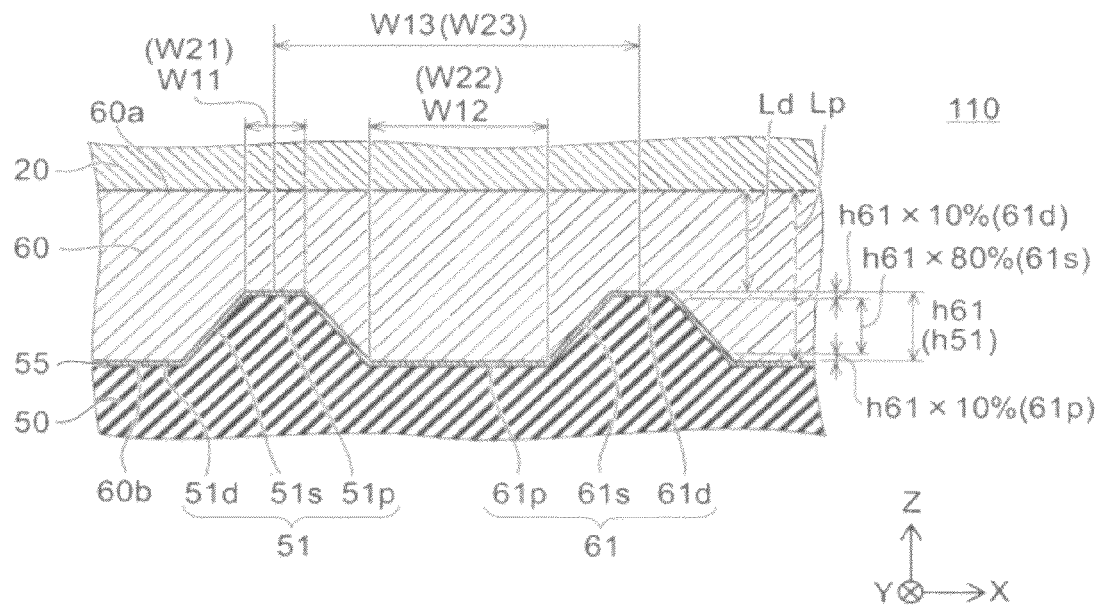

FIG. 4A and FIG. 4B are schematic views illustrating the configuration of a portion of the semiconductor light emitting device according to the first embodiment.

Namely, FIG. 4A is a schematic plan view illustrating the unevenness 61 of the foundation layer 60. FIG. 4B is a cross-sectional view along line A3-A4 of FIG. 4A.

As illustrated in FIG. 4A, a continuous protrusion 61p and multiple recesses 61d are provided in the foundation layer 60. In such a case, a continuous substrate recess 51d and multiple substrate protrusions 51p are provided in the substrate 50.

However, the embodiment is not limited thereto. A continuous recess 61d and multiple protrusions 61p may be provided in the foundation layer 60. In such a case, a continuous substrate protrusion 51p and multiple substrate recesses 51d are provided in the substrate 50. Also, multiple protrusions 61p and multiple recesses 61d may be provided in the foundation layer 60. In such a case, multiple substrate recesses 51d and multiple substrate protrusions 51p are provided in the substrate 50.

For example, one continuous protrusion 61p may be provided in a spiral configuration in the foundation layer 60 with a portion other than the protrusion 61p forming one continuous recess 61d (a spiral configuration). In such a case, in the substrate 50, one continuous substrate recess 51d is provided in a spiral configuration with a portion other than the substrate recess 51 forming one continuous substrate protrusion 51d (a spiral configuration). In other words, for example, it is sufficient for at least one selected from multiple protrusions and multiple recesses to be formed when the foundation layer 60 (or the substrate 50) is cut by a plane including the Z-axis.

The case will now be described where the continuous protrusion 61p and the multiple recesses 61d are provided in the foundation layer 60.

As illustrated in FIG. 4A, the multiple recesses 61d of the unevenness 61 of the foundation layer 60 are respectively disposed at, for example, the center and the six corners of a regular hexagon when viewed along the Z-axis. In such a case, the multiple substrate protrusions 51p of the substrate 50 are respectively disposed at the center and the six corners of the regular hexagon. However, the disposition of the multiple recesses 61d is arbitrary. The disposition of the multiple substrate protrusions 51p is arbitrary.

In this example, the planar configuration of the recess 61d (the configuration when viewed along the Z-axis) is a circle. In such a case, the planar configuration of the substrate protrusion 51p also is a circle. However, the embodiment is not limited thereto. The planar configuration of the recess 61d is arbitrary. In other words, the planar configuration of the substrate protrusion 51p is arbitrary.

For example, the multiple substrate protrusions 51p are formed in a repeating pattern in the major surface of the substrate 50 on the second semiconductor layer 20 side.

For example, the region of the major surface of the substrate 50 that becomes the substrate side portion 51s and the substrate recess 51d is selectively etched. Thereby, the substrate protrusion 51p, the substrate side portion 51s, and the substrate recess 51d are made.

The unevenness 61 is formed in the second major surface 60b of the foundation layer 60 by forming the foundation layer 60 on the major surface of the substrate 50 which has the substrate unevenness 51. In this example, the buffer layer 55 is formed on the major surface of the substrate 50; and the foundation layer 60 is formed on the buffer layer 55. The configuration of the unevenness 61 of the foundation layer 60 is substantially maintained even after removing the substrate 50 (and the buffer layer 55).

The portions of the foundation layer 60 facing the substrate protrusion 51p become the recesses 61d; the portions of the foundation layer 60 facing the substrate recess 51d become the protrusions 61p; and the portions of the foundation layer 60 facing the substrate side portions 51s become the side portions 61s.

The thickness of the buffer layer 55 is, for example, not less than about 10 nm and not more than about 50 nm. On the other hand, the height (the depth) and the period of the substrate unevenness 51 are, for example, not less than about 500 nm and not more than about 3 μm. Thus, the unevenness 61 that substantially reflects the configuration of the substrate unevenness 51 is formed in the foundation layer 60 because the thickness of the buffer layer 55 is sufficiently thinner than the height (the depth) and the period of the substrate unevenness 51.

As illustrated in FIG. 4B, a distance Lp along the Z-axis between the protrusion 61p and the second semiconductor layer 20 is longer than a distance Ld along the Z-axis between the recess 61d and the second semiconductor layer 20. The distance along the Z-axis between the recess 61d and the protrusion 61p (the difference between the distance Lp and the distance Ld) corresponds to a height h61 (or a depth) between the recess 61d and the protrusion 61p. A height of the unevenness 61 is, for example, 500 nm or more and 3 μm or less. A periodicity of the unevenness 61 is, for example, 500 nm or more and 3 μm or less.

The protrusion 61p is, for example, the portion from the most protruding portion of the unevenness 61 to the position of 10% of the height h61 from the most protruding portion of the unevenness 61. The recess 61d is, for example, the portion from the most receding portion of the unevenness 61 to the position of 10% of the height h61 (the depth) from the most receding portion of the unevenness 61. The side portion 61s is the portion of the unevenness 61 other than the protrusion 61p and the recess 61d (the portion of 80% of the height h61).

Herein, to simplify the description, the substrate protrusion 51p of the substrate 50 is taken to be positioned higher than the substrate recess 51d. In such a case, the protrusion 61p of the foundation layer 60 is positioned lower than the recess 61d.

The continuous substrate recess 51d and the multiple substrate protrusions 51p are provided in the substrate 50. The continuous protrusion 61p and the multiple recesses 61d are provided in the foundation layer 60. Hereinbelow, the description focuses on two of the multiple substrate protrusions 51p. The case is described where the line connecting the centers of the two substrate protrusions 51p (the centroids of the planar configurations when viewed along the Z-axis) is parallel to the X-axis. In such a case, the line connecting these two centers of the multiple recesses 61d is parallel to the X-axis.

A height h51 of each of the multiple substrate protrusions 51p (i.e., the depth of the substrate recess 51d) is, for example, about 1 micrometer (μm). A width W22 (a length along the X-axis) of the substrate recess 51d between the two substrate protrusions 51p juxtaposed along the X-axis is, for example, about 1.5 μm. A spacing W23 along the X-axis between the centers of the two substrate protrusions 51p juxtaposed along the X-axis is, for example, about 5 μm. In this example, the spacing between the centers of the multiple substrate recesses 51d obtained when the substrate 50 is cut by an X-Z plane passing through the centers of the two substrate protrusions 51p juxtaposed along the X-axis is the same as the spacing W23. A width W21 along the X-axis of the substrate protrusion 51p is, for example, about 2 μm.

As described above, the thickness of the buffer layer 55 is sufficiently thinner than the height (the depth) and the period of the substrate unevenness 51. In such a case, the thickness of the buffer layer 55 substantially can be ignored; and the configuration of the unevenness 61 of the foundation layer 60 substantially matches the configuration of the substrate unevenness 51 of the substrate 50.

The height h61 of the protrusion 61p of the foundation layer 60 (i.e., the depth of each of the multiple recesses 61d) is, for example, about 1 μm. In the foundation layer 60, a width W12 of the protrusion 61p (a length along the X-axis) between two recess 61d juxtaposed along the X-axis is, for example, about 1.5 μm. In the foundation layer 60, a spacing W13 along the X-axis between the centers of the two recesses 61d juxtaposed along the X-axis is, for example, about 5 μm. In this example, the spacing between the centers of the multiple protrusions 61p obtained when the foundation layer 60 is cut by an X-Z plane passing through the centers of the two recesses 61d juxtaposed along the X-axis is the same as the spacing W13. A width W11 along the X-axis of the recess 61d of the foundation layer 60 is, for example, about 2 μm.

The description recited above is one example of the substrate unevenness 51 of the substrate 50 and the unevenness 61 of the foundation layer 60; and the embodiment is not limited thereto. Even in the case where the continuous substrate protrusion 51p and the multiple substrate recesses 51d are provided in the substrate 50 and the continuous recess 61d and the multiple protrusions 61p are provided in the foundation layer 60, for example, the configuration of the unevenness 61 of the foundation layer 60 substantially matches the configuration of the substrate unevenness 51 of the substrate 50.

The foundation layer 60 has dislocations. The dislocations are crystal defects having line configurations. The dislocations occurring in the foundation layer 60 will now be described.

Figure 1B:
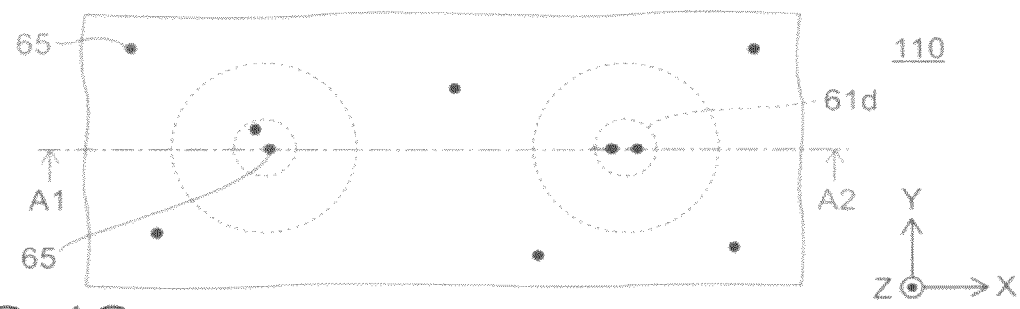
Figure 1C:
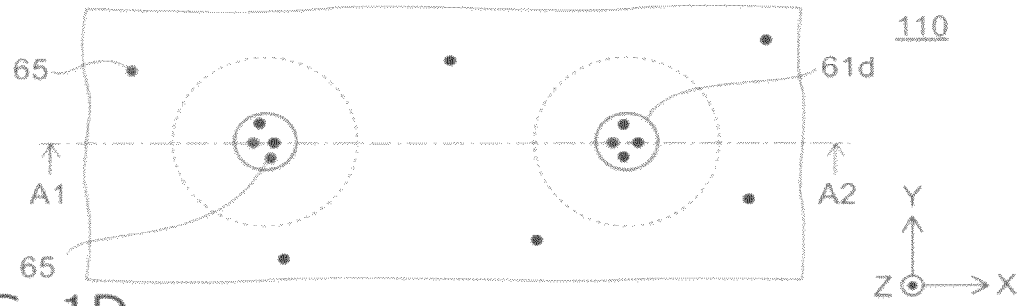
Figure 1D:
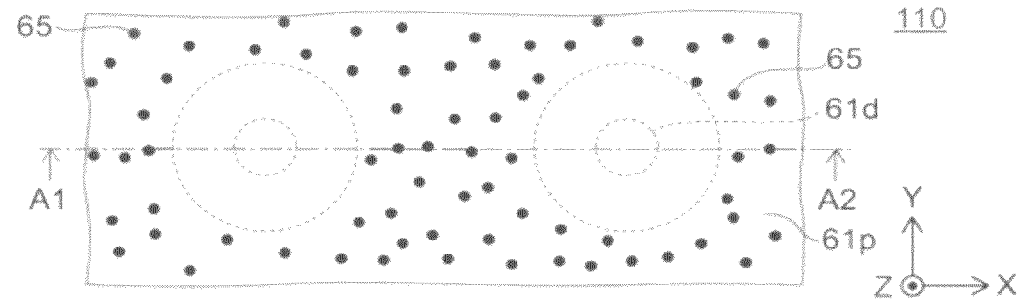

FIG. 1A is a cross-sectional view along line A1-A2 of FIG. 1B to FIG. 1D. FIG. 1B, FIG. 1C, and FIG. 1D are plan views of the B1 plane, the C1 plane, and the D1 plane of FIG. 1A, respectively. The B1 plane, the C1 plane, and the D1 plane are planes perpendicular to the Z-axis. FIG. 1B illustrates the dislocations 65 at the first major surface 60a of the foundation layer 60. FIG. 1C illustrates the dislocations 65 at a plane including the recess 61d of the foundation layer 60. FIG. 1D illustrates the dislocations 65 at a plane including the protrusion 61p of the foundation layer 60.

As illustrated in FIG. 1A, the dislocations 65 occur in the foundation layer 60. For example, the dislocations 65 occur when the buffer layer 55 is formed on the major surface of the substrate 50 and crystal growth of the foundation layer 60 on the buffer layer 55 is performed. The dislocations 65 form at least inside the foundation layer 60. The dislocations 65 substantially reach the major surface of the substrate 50 via the buffer layer 55. The dislocations 65 form from the major surface of the substrate 50 toward the first major surface 60a during the crystal growth of the foundation layer 60.

As illustrated in FIG. 1A, at least one of the dislocations 65 reaching the protrusion 61p also reaches the protrusion 61p at the other end of the at least one of the dislocations 65 and does not reach the first major surface 60a. In other words, a dislocation 65 occurring from the substrate recess 51d reaches the substrate recess 51d and does not reach the first major surface 60a.

As illustrated in FIG. 1A, at least one of the dislocations 65 reaching the protrusion 61p also reaches the side portion 61s and does not reach the first major surface 60a. In other words, a dislocation 65 occurring from the substrate recess 51d reaches the substrate side portion 51s and does not reach the first major surface 60a.

Although not illustrated in FIG. 1A, a very small portion of the dislocations 65 reaching the protrusion 61p (the dislocations 65 reaching the substrate recess 51d) reach the first major surface 60a; and the remaining greater part is annihilated without reaching the first major surface 60a.

In other words, as illustrated in FIG. 1D, a relatively large number of dislocations 65 reach the protrusion 61p. The dislocations 65 reaching the protrusion 61p occur from the protrusion 61p and from the substrate recess 51d.

As illustrated in FIG. 1C, in the plane including the recess 61d (the plane substantially including the substrate protrusion 51p), the dislocations 65 of the region overlaying the protrusion 61p when viewed along the Z-axis markedly decrease. This is because the dislocations 65 occurring from the protrusion 61p have been annihilated at the height of the plane including the recess 61d by reaching the side portion 61s.

As illustrated in FIG. 1B, as expected, the number of the dislocations 65 of the region of the first major surface 60a overlaying the protrusion 61p when viewed along the Z-axis is low. Thus, a very small portion of the dislocations 65 reaching the protrusion 61p reaches the first major surface 60a; and the remaining greater part is annihilated without reaching the first major surface 60a by reaching the side portion 61s.

On the other hand, as illustrated in FIG. 1A, FIG. 1B, and FIG. 1C, the dislocations 65 occurring from the recess 61d also decrease toward the first major surface 60a from the recess 61d. However, the degree of the decrease is not as large as the degree of the decrease at the first major surface 60a of the dislocations 65 occurring from the protrusion 61p.

For example, comparing FIG. 1B and FIG. 1D, about 10% of the dislocations 65 reaching the protrusion 61p reach the first major surface 60a; and the remaining about 90% is annihilated without reaching the first major surface 60a. On the other hand, comparing FIG. 1B and FIG. 1C, about 50% of the dislocations 65 reaching the recess 61d reach the first major surface 60a; and the remaining about 50% is annihilated without reaching the first major surface 60a.

Thus, the proportion of the number of the dislocations 65 reaching the protrusion 61p and reaching the first major surface 60a to the number of all of the dislocations 65 reaching the protrusion 61p (in the example recited above, 10%) is lower than the proportion of the number of the dislocations 65 reaching the recess 61d and reaching the first major surface 60a to the number of all of the dislocations 65 reaching the recess 61d (in the example recited above, 50%).

As recited above, about 50% of all of the dislocations 65 reaching the recess 61d also reach the region of the first major surface 60a overlaying the recess 61d when viewed along the Z-axis. In other words, the number of the dislocations 65 reaching the region of the first major surface 60a overlaying the recess 61d when viewed along the Z-axis direction (the stacking direction from the second major surface 60b toward the first major surface 60a) is less than the number of the dislocations 65 reaching the recess 61d. In other words, the dislocations 65 reaching the recess 61d are fewer at the position (the height) of the first major surface 60a.

FIG. 1A to FIG. 1D recited above schematically illustrate the dislocations 65. Accordingly, for example, the value of the proportion of the number of the dislocations 65 reaching the protrusion 61p and reaching the first major surface 60a to the number of all of the dislocations 65 reaching the protrusion 61p and the value of the proportion of the number of the dislocations 65 reaching the recess 61d and reaching the first major surface 60a to the number of all of the dislocations 65 reaching the recess 61d are not limited to the values described above. In the embodiment, the relative size relationship of the values recited above is maintained.

In the foundation layer 60, in the case where the protrusion 61p is continuous and the multiple recesses 61d are provided, "the dislocations 65 reaching the protrusion 61p and reaching the first major surface 60a" may be taken as, for example, the dislocations 65 reaching the first major surface 60a and reaching the protrusions 61p included in the unit surface area of a plane perpendicular to the Z-axis. In such a case, "all of the dislocations 65 reaching the protrusion 61p" may be taken as all of the dislocations 65 reaching the protrusions 61p included in the unit surface area of a plane perpendicular to the Z-axis.

In the case where the multiple recesses 61d are provided, "the dislocations 65 reaching the recess 61d and reaching the first major surface 60a" may be taken as, for example, the dislocations 65 reaching the first major surface 60a and reaching one recess 61d. In such a case, "all of the dislocations 65 reaching the recess 61d" may be taken as all of the dislocations 65 reaching the one recess 61d.

Or, "the dislocations 65 reaching the recess 61d and reaching the first major surface 60a" may be taken as, for example, the dislocations 65 reaching the first major surface 60a and reaching the recesses 61d included in the unit surface area of a plane perpendicular to the Z-axis. In such a case, "all of the dislocations 65 reaching the recess 61d" may be taken as all of the dislocations 65 reaching the recesses 61d included in the unit surface area of a plane perpendicular to the Z-axis.

"The dislocations 65 reaching the region of the first major surface 60a overlaying the recess 61d when viewed along the Z-axis direction" may be taken as, for example, the dislocations 65 reaching the region of the first major surface 60a overlaying the recesses 61d when viewed along the Z-axis direction for the recesses 61d included in the unit surface area of a plane perpendicular to the Z-axis.

On the other hand, in the case where the recess 61d is continuous and the multiple protrusions 61p are provided in the foundation layer 60, for example, characteristics relating to the recess 61d included in the unit surface area of a plane perpendicular to the Z-axis may be used for the recess 61d. For example, characteristics relating to one protrusion 61p or characteristics relating to the protrusions 61p included in the unit surface area of a plane perpendicular to the Z-axis may be used for the protrusion 61p.

The case where the semiconductor light emitting device 110 further includes the substrate 50 provided on the second major surface 60b side of the foundation layer 60 is as follows.

The foundation layer 60 is disposed between the substrate 50 and the second semiconductor layer 20. The substrate 50 has the substrate unevenness 51 facing the unevenness 61 of the foundation layer 60. The substrate 50 includes the substrate unevenness 51 provided in the surface facing the foundation layer 60. The substrate unevenness 51 includes the substrate recess 51d, the substrate side portion 51s, and the substrate protrusion 51p.

At least one of the dislocations 65 reaching the substrate recess 51d also reaches the substrate side portion 51s and does not reach the first major surface 60a of the foundation layer 60.

The proportion of the number of the dislocations 65 reaching the substrate recess 51d and reaching the first major surface 60a to the number of all of the dislocations 65 reaching the substrate recess 51d is lower than the proportion of the number of the dislocations 65 reaching the substrate protrusion 51p and reaching the first major surface 60a to the number of all of the dislocations 65 reaching the substrate protrusion 51p.

The number of the dislocations 65 reaching the region of the first major surface 60a overlaying the substrate protrusion 51p when viewed along the Z-axis direction is less than the number of the dislocations 65 reaching the substrate protrusion 51p. In other words, the dislocations 65 reaching the substrate protrusion 51p are fewer at the position (the height) of the first major surface 60a.

By such a configuration, a nitride semiconductor light emitting device having high efficiency can be provided with both a low dislocation density and high surface flatness.

One example of the method for manufacturing the semiconductor light emitting device 110 according to the embodiment will now be described.

Figure 5A:
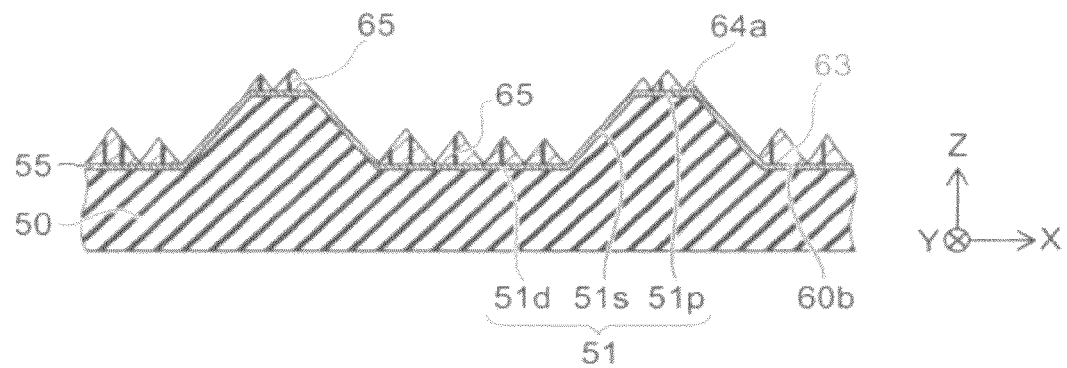
FIG. 5A to FIG. 5C are schematic cross-sectional views in order of the processes, illustrating a method for manufacturing the semiconductor light emitting device according to the first embodiment.
Figure 5B:
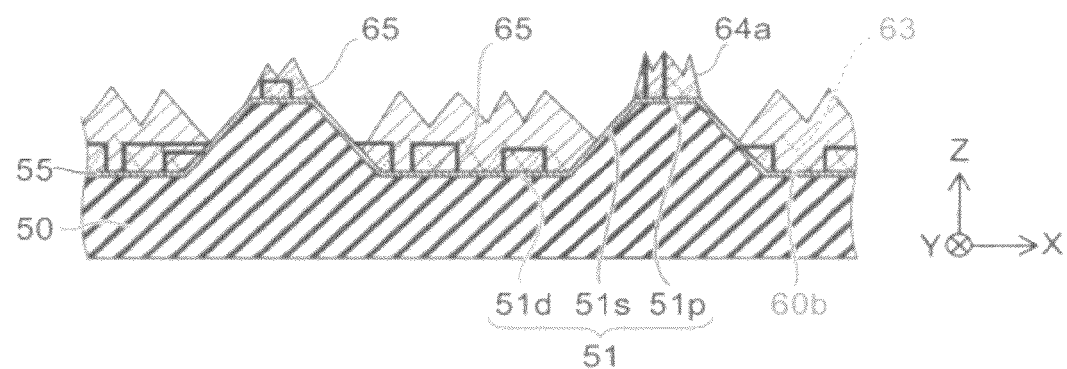
Figure 5C:
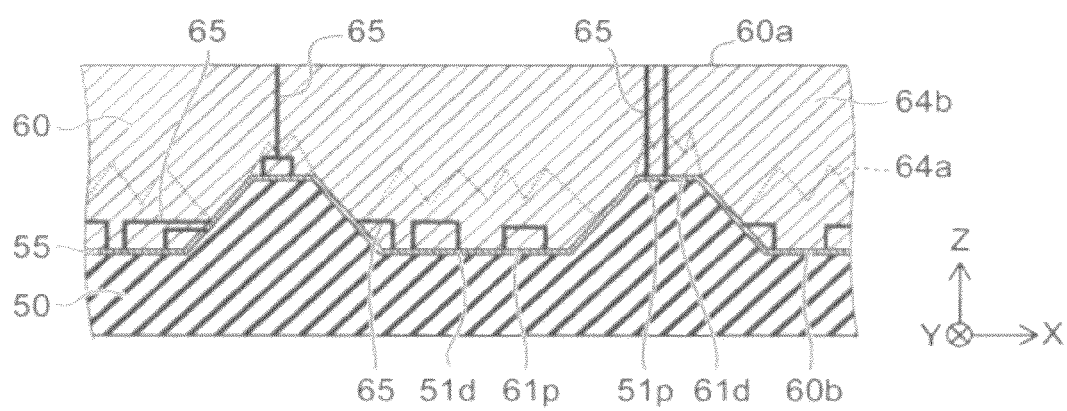

FIG. 5A to FIG. 5C are schematic cross-sectional views in order of the processes, illustrating the method for manufacturing the semiconductor light emitting device according to the first embodiment.

Namely, these drawings illustrate the method for forming the foundation layer 60.

As illustrated in FIG. 5A, a first layer 64a is formed on the major surface of the substrate 50 where the substrate unevenness 51 is provided (in this example, on the buffer layer 55) using the group III source material and the group V source material. The first layer 64a includes a nitride semiconductor. The first layer 64a is a portion of the foundation layer 60.

In the initial stage, the first layer 64a is multiple microcrystals 63. The width of each of the multiple microcrystals 63 (the width along a direction perpendicular to the Z-axis) and the height of each of the multiple microcrystals 63 is, for example, about 30 nm. The multiple microcrystals 63 (the first layer 64a) are formed on the substrate recess 51d and on the substrate protrusion 51p. The dislocations 65 form in the microcrystals 63. The dislocations 65 extend along, for example, the Z-axis.

Pits easily form at portions of the substrate 50 that are not covered with the microcrystals 63. It is favorable for the multiple microcrystals 63 to cover the major surface of the substrate 50. Thereby, the formation of pits is suppressed.

As illustrated in FIG. 5B, the formation of the first layer 64a continues. Thereby, the thickness of the first layer 64a increases while maintaining the configuration of the microcrystals 63 illustrated in FIG. 5B. The thickness of the first layer 64a is about the height of the substrate protrusion 51p.

In this process, the extension directions of a portion of the dislocations 65 extending along the Z-axis at the lower surface of the first layer 64a change to directions intersecting the Z-axis (e.g., directions perpendicular to the Z-axis). Then, a portion of the dislocations 65 is annihilated by these dislocations 65 colliding with each other when the multiple microcrystals 63 combine.

A portion of the dislocations 65 for which the extension directions change to directions intersecting the Z-axis above the substrate recess 51d collide with the substrate side portion 51s and are annihilated.

As illustrated in FIG. 5C, a second layer 64b is formed on the first layer 64a using a group III source material and a group V source material. The second layer 64b includes a nitride semiconductor. The second layer 64b is a layer used to form another portion of the foundation layer 60.

In the formation of the second layer 64b, for example, a condition is employed in which the growth rate of the second layer 64b along the Z-axis is faster than the growth rate of the second layer 64b in the direction perpendicular to the Z-axis. Thereby, planarizing is possible by combining the portion grown from the substrate recess 51d with the portion grown from the substrate protrusion 51p. In other words, the growth from the substrate recess 51d is relatively faster than the growth from the substrate protrusion 51p by increasing the growth rate of the stacking direction of the formation of the second layer 64b. Thereby, the filling of the substrate recess 51d is promoted. Thereby, the flatness can be higher. Also, the film thickness necessary for planarizing can be thinner.

The foundation layer 60 is fabricated from such a first layer 64a and second layer 64b. Subsequently, the second semiconductor layer 20 (and the multilayered structural body 40), the light emitting layer 30, and the first semiconductor layer 10 are formed on the foundation layer 60; the electrodes are formed and patterned into the prescribed configurations; and the semiconductor light emitting device 110 is obtained.

In the formation method as recited above, the dislocations 65 are reduced during the formation of the first layer 64a; and high flatness is obtained by the subsequent formation of the second layer 64b. Thereby, a nitride semiconductor light emitting device having high efficiency is obtained with both a low dislocation density and high surface flatness.

In other words, in the formation of the foundation layer 60, the dislocations 65 are bent in the region not higher than the height of the substrate unevenness 51 (the region along the Z-axis between the substrate protrusion 51p and the substrate recess 51d). Subsequently, the substrate unevenness 51 is filled. During this filling, it is unnecessary to bend the extension directions of the dislocations 65 because many of the dislocations 65 already have changed to directions intersecting the Z-axis (e.g., orthogonal directions). Thereby, both high surface flatness and a lower dislocation density can be realized.

In the formation of the first layer 64a of the formation method, the extension directions of the dislocations 65 are caused to change to directions intersecting the Z-axis direction (e.g., orthogonal directions) in a region not higher than the height of the substrate protrusion 51p. Thereby, the dislocations 65 occurring at the substrate recess 51d (the dislocations 65 reaching the protrusion 61p of the foundation layer 60) decrease drastically inside the region of the height not higher than the substrate protrusion 51p. By using the region not higher than this height, the dislocations 65 that reach the first major surface 60a when the propagation directions of the dislocations 65 (the extension directions) change again can be suppressed drastically because a portion of the dislocations 65 for which the extension directions change to directions intersecting the Z-axis above the substrate recess 51d collides with the substrate side portion 51s and is annihilated; and a large dislocation reduction effect is obtained.

For example, the position of the change of the propagation directions of the dislocations 65 (the position along the Z-axis direction) changes with the size of the microcrystals 63. The dislocation density proximal to the substrate recess 51d is higher than the dislocation density on the side proximal to the first major surface 60a. The proportion of the dislocations 65 that encounter each other during the combination of the microcrystals 63 increases as the position of the change of the propagation directions of the dislocations 65 approaches the substrate recess 51d. Therefore, the dislocation reduction effect is larger as the position of the change of the propagation directions of the dislocations 65 approaches the substrate recess 51d. The dislocation reduction effect increases and is favorable as the size of the microcrystals 63 decreases in the initial growth stage of the foundation layer 60.

On the other hand, because the growth in the stacking direction is faster for the second layer 64b, the degree of the decrease of the dislocations 65 of the second layer 64b is lower than the degree of the decrease of the dislocations 65 of the first layer 64a.

In the embodiment, the planar configurations of the substrate recess 51d and the substrate protrusion 51p (the configurations when viewed along the Z-axis) are arbitrary. Similarly, the planar configurations of the protrusion 61p and the recess 61d of the foundation layer 60 are arbitrary. The planar configurations of the substrate recess 51d and the substrate protrusion 51p and the planar configurations of the protrusion 61p and the recess 61d of the foundation layer 60 may include, for example, various configurations such as quadrilaterals (including diamonds, etc.), hexagons, circles, flattened circles, and the like.

In the first layer 64a, the dislocations 65 decrease inside the region not higher than the height of the substrate protrusion 51p. Therefore, it is favorable for the width W22 of the substrate recess 51d (the length along a direction perpendicular to the Z-axis) to be greater than the width W21 of the substrate protrusion 51p (the length along a direction perpendicular to the Z-axis). Similarly, the dislocations 65 of the first layer 64a decrease in the region not higher than the height of the protrusion 61p of the foundation layer 60 (the region along the Z-axis between the protrusion 61p and the recess 61d). Therefore, it is favorable for the width W12 of the protrusion 61p of the foundation layer 60 (the length along the direction perpendicular to the Z-axis) to be greater than the width W11 of the recess 61d (the length along the direction perpendicular to the Z-axis). Thereby, the dislocation reduction effect of the first layer 64a can be increased.

In the embodiment, the height h51 of the substrate protrusion 51p (the depth of the substrate recess 51d) and the depth of the recess 61d of the foundation layer 60 (the height h61 of the protrusion 61p) are arbitrary.

It is favorable for the height h51 of the substrate protrusion 51p and the height h61 of the protrusion 61p of the foundation layer 60 to be greater than the half-wavelength ($\lambda/2$) of a peak wavelength $\lambda$ of the light emitted from the light emitting layer 30. Thereby, the light extraction efficiency can be increased by the diffraction effect of the light.

The surface flatness worsens easily when the foundation layer 60 is formed on the substrate unevenness 51 in the case where the height h51 of the substrate protrusion 51p and the height h61 of the protrusion 61p of the foundation layer 60 are increased too much. For example, it is favorable for the height h51 and the height h61 to be not more than the width W22 of the substrate recess 51d (i.e., the width W12 of the protrusion 61p of the foundation layer 60). Thereby, high surface flatness is obtained more easily.

One example of the method for manufacturing the semiconductor light emitting device 110 according to the embodiment will now be described more specifically.

A photoresist having a pattern used to form the substrate unevenness 51 is formed on the major surface of the substrate 50 of sapphire. The photoresist includes, for example, multiple circular patterns. The multiple circular patterns respectively cover portions of the major surface of the substrate 50 used to form the substrate protrusions 51p. The substrate 50 of the portions exposed from the circular patterns of the photoresist is etched using an RIE (Reactive Ion Etching) apparatus. Thereby, the substrate recess 51d is made with a depth of about 1 µm. The width W22 is about 1.5 µm. The spacing W23 corresponding to the pitch is about 5 µm. The pitch is the minimum distance between the centers of adjacent patterns having similar configurations. The substrate 50 is not limited to a sapphire substrate and may include silicon (Si), gallium arsenide (GaAs), silicon carbide (SiC), a GaN substrate, an AlN substrate, and the like.

The substrate 50 is processed using organic cleaning and acid cleaning; and the substrate 50 is placed in the reaction chamber of an MOCVD system. The buffer layer 55 is formed using trimethylgallium (TMGa), trimethylaluminum (TMAl), and ammonia ($NH_3$). The buffer layer 55 is, for example, a GaN layer. The thickness of the buffer layer 55 is about 30 nm.

Then, the foundation layer 60 is formed using the TMGa and the ammonia in an atmosphere including nitrogen and hydrogen at 1120° C. The foundation layer 60 is, for example, an undoped GaN layer. The thickness of the foundation layer 60 is, for example, about 3 µm. Specifically, as described above, the first layer 64a and the second layer 64b are formed.

First, for example, the multiple microcrystals 63 of GaN are formed on the substrate recess 51d and on the substrate protrusion 51p with a width of 30 nm and a height of 30 nm. Continuing, a GaN layer is grown. Thereby, the microcrystals 63 are caused to combine with each other; and a GaN layer is grown on the substrate recess 51d to a thickness of 0.5 µm. The GaN layer having the thickness of 0.5 µm is used to form the first layer 64a. The microcrystals 63 recited above are taken to be included in the first layer 64a. The formation of the first layer 64a is called a first process.

Subsequently, a second process is implemented in which the second layer 64b is formed on the first layer 64a. In this example, the temperature of the formation of the second layer 64b is 1120° C. which is the same as the temperature of the formation of the first layer 64a. The supply amount of the ammonia of the second process is, for example, four times the supply amount of the ammonia of the first process. In the second process, the hydrogen of the carrier gas is reduced by the amount that the ammonia is increased. In other words, the total supply amount of the gas of the second process is the same as the total supply amount of the gas of the first process. By forming the second layer 64b at these conditions, the total thickness of the first layer 64a and the second layer 64b is about 3 μm. In other words, the thickness of the second layer 64b is about 2.5 μm. Thereby, the foundation layer 60 (having a thickness of about 3 μm) is formed.

Then, the second semiconductor layer 20 (the n-side contact layer) is formed using silane ($SiH_4$) as the impurity source gas. The thickness of the second semiconductor layer 20 is, for example, 4 μm. In this example, the temperature of the formation of the second semiconductor layer 20 is 1100° C. which is lower than that of the formation of the first layer 64a and second layer 64b.

Continuing, the multilayered structural body 40 is formed. Specifically, for example, an undoped GaN film (the first structural body film) is formed using TMGa and ammonia in a nitrogen atmosphere at 800° C. The thickness of the first structural body film is, for example, 3 nm. Continuing, an undoped $In_{0.07}Ga_{0.93}N$ film (the second structural body film) is formed by adding trimethylindium (TMIn) at 800° C. The thickness of the second structural body film is, for example, 1 nm. The formation of the first structural body film and the second structural body film is repeated a total of 20 times. Then, finally, an undoped GaN film (the first structural body film) is formed with a thickness of 3 nm. Thereby, the multilayered structural body 40 is formed.

Then, the light emitting layer 30 is formed. Specifically, for example, an undoped GaN layer (the 1st barrier layer BL1 of the multiple barrier layers 31) is formed using TMGa and ammonia in a nitrogen atmosphere with the temperature of the substrate 50 at 850° C. The thickness of this GaN layer is, for example, 5 nm. Continuing, an undoped $In_{0.15}Ga_{0.85}N$ layer (the 1st well layer WL1 of the multiple well layers 32) is formed using TMGa, TMIn, and ammonia with the temperature of the substrate 50 at 730° C. The thickness of this $In_{0.15}Ga_{0.85}N$ layer is, for example, 2.5 nm. Subsequently, the light emitting layer 30 is formed by repeating the formation of the barrier layer 31 recited above and the formation of the well layer 32 recited above.

Then, the third p-side layer 13 is formed using TMAl, TMGa, and ammonia and bis(cyclopentadienyl)magnesium ($Cp_2Mg$) as the impurity source material in an atmosphere including nitrogen and hydrogen at 1030° C. Then, the second p-side layer 12 is formed using TMGa and ammonia. Subsequently, the first p-side layer 11 (the p-side contact layer) is formed. The thickness of the third p-side layer 13 is, for example, 10 nm; the thickness of the second p-side layer 12 is, for example, 80 nm; and the thickness of the first p-side layer 11 is, for example, 10 nm. Thereby, the first semiconductor layer 10 is formed.

After the growth of the crystal recited above, the temperature is reduced to room temperature. A portion of the second semiconductor layer 20 is exposed by performing dry etching of the stacked structural body 10s from the major surface on the first p-side layer 11 side until a thickness partway through the second semiconductor layer 20 is reached. Then, the second electrode 80 made of a stacked film of Ti/Pt/Au is formed on the exposed second semiconductor layer 20. The first electrode 70 made of ITO is formed on the first p-side layer 11. Thereby, the semiconductor light emitting device 110 is formed.

Experiments performed independently by the inventor to create the configuration according to the embodiment will now be described.

In these experiments, the formation condition of the foundation layer 60 is different from the formation condition of the foundation layer 60 of the formation method according to the embodiment. Namely, in the embodiment, the formation of the foundation layer 60 includes the formation of the first layer 64a (the first process) and the formation of the second layer 64b (the second process) having a different formation condition than the first layer 64a. In contrast, in the experiments described below, the formation condition of the foundation layer 60 was constant for one foundation layer 60. At this time, the foundation layer 60 was formed by changing various source material supply ratios during the formation of the foundation layer 60; and the dislocations 65 and the pits of the foundation layer 60 were evaluated. In these experiments, the conditions of the substrate 50 and the buffer layer 55 were the same as the conditions described in regard to the embodiment.

Figure 6A:
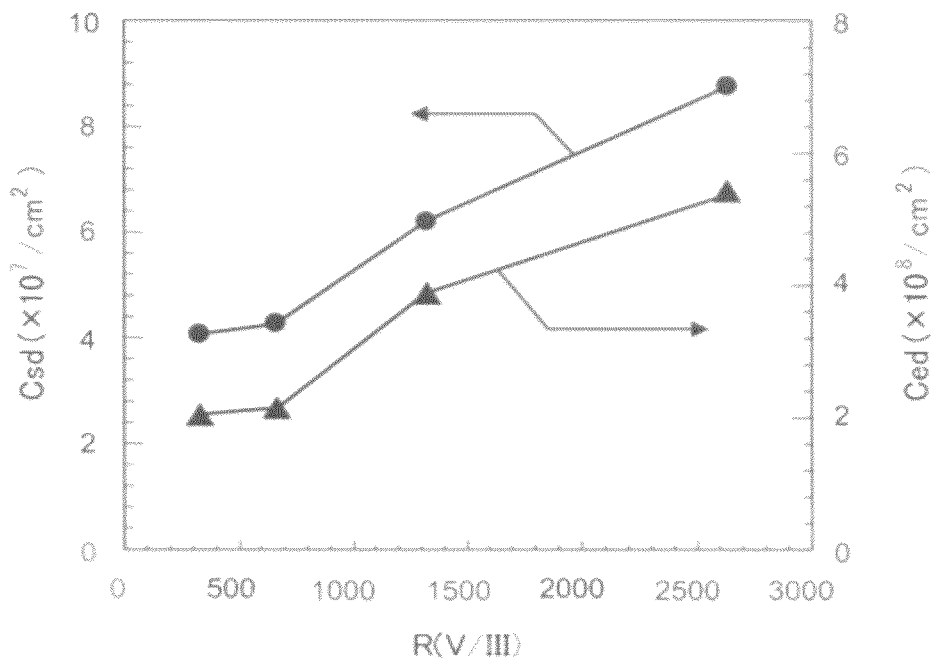
FIG. 6A and FIG. 6B are graphs illustrating experimental results relating to the semiconductor light emitting device.
Figure 6B:
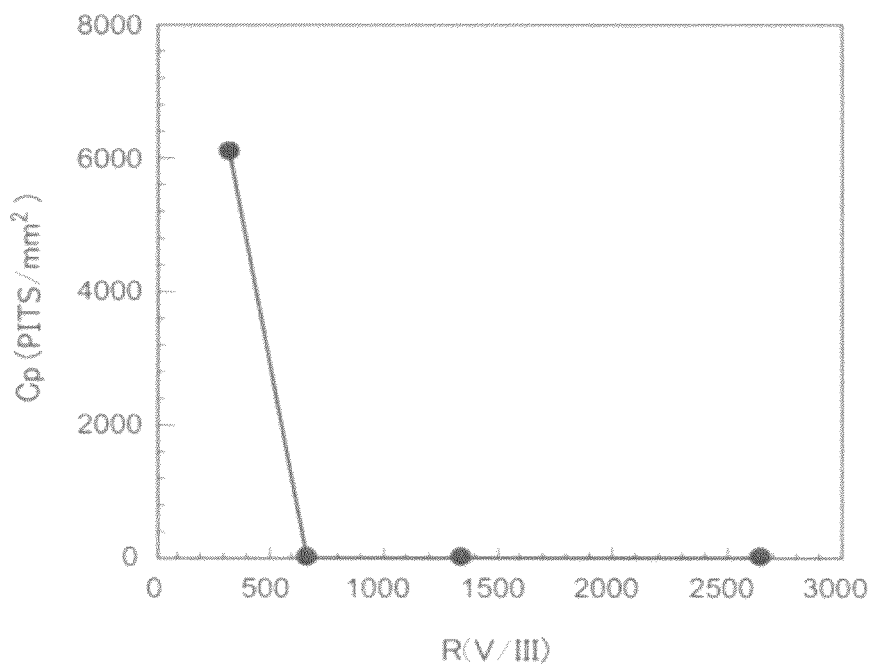

FIG. 6A and FIG. 6B are graphs illustrating experimental results relating to the semiconductor light emitting device.

FIG. 6A illustrates the evaluation result of the density of the dislocations 65; and FIG. 6B illustrates the evaluation result of the density of pits. In these drawings, the horizontal axis is the proportion of the supply amount of the group V source material to the supply amount of the group III source material, i.e., a group V/group III ratio R (V/III), when forming the foundation layer 60. In these experiments as illustrated in these drawings, the four types of the group V/group III ratios R (V/III) of 330, 660, 1320, and 2640 were used. In FIG. 6A, the vertical axis of the left side illustrates a screw dislocation density Csd of the foundation layer 60; and the vertical axis of the right side illustrates an edge dislocation density Ced. The vertical axis of FIG. 6B illustrates a pit density Cp. The screw dislocation density Csd and the edge dislocation density Ced were determined from the rocking curve widths at half maximum of the symmetric plane and the asymmetric plane of the X-ray diffraction measurements of the samples and TEM (Transmission Electron Microscope) images of the samples. The edge dislocation density Ced and the screw dislocation density Csd are densities of the first major surface 60a of the foundation layer 60. The pit density Cp was determined from SEM (Scanning Electron Microscope) images.

When forming the foundation layer 60 as illustrated in FIG. 6A, the dislocation densities (the screw dislocation density Csd and the edge dislocation density Ced) are low when the group V/group III ratio R (V/III) is low.

As illustrated in FIG. 6B, the pit density Cp is high when the group V/group III ratio R (V/III) is low. When the pit density Cp is high, the flatness of the foundation layer 60 is poor and voids occur. In other words, in the case where the foundation layer 60 is formed at the condition at which the group V/group III ratio R (V/III) is low, the flatness is poor; and, for example, voids and the like also occur.

It can be seen from FIG. 6A and FIG. 6B that there is a trade-off relationship relating to the group V/group III ratio R (V/III) between reducing the dislocation densities and reducing the pit density Cp. The group V/group III ratio R (V/III) at which low dislocation densities are stably obtained while maintaining a low pit density Cp (e.g., where the pit density Cp is 0) is, for example, 1320. At this time, the edge dislocation density Ced is about $4 \times 10^8/cm^2$. In other words, in the reference example in which the foundation layer 60 is formed using one condition, the edge dislocation density Ced is not less than about $4 \times 10^8/\text{cm}^2$ when the pit density Cp is kept stably at 0.

Figure 7:
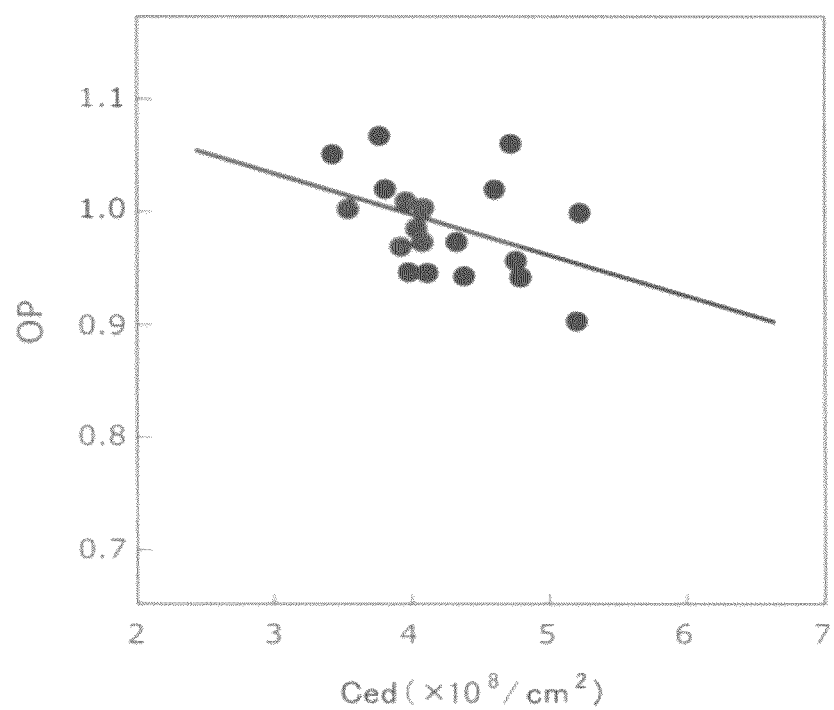
FIG. 7 is a graph illustrating experimental results relating to the semiconductor light emitting device.

FIG. 7 is a graph illustrating experimental results relating to the semiconductor light emitting device.

This drawing illustrates the evaluation results of the relationship between the edge dislocation density Ced and a light output OP of the semiconductor light emitting device. The horizontal axis illustrates the edge dislocation density Ced; and the vertical axis illustrates the light output OP (a standardized value).

As illustrated in FIG. 7, the light output OP of the semiconductor light emitting device increases as the edge dislocation density Ced decreases. It is favorable for the edge dislocation density Ced to be as low as possible to obtain a high light output OP. However, as described in regard to FIG. 6A and FIG. 6B, there is a trade-off relationship between reducing the dislocation density and reducing the pit density Cp; and there is a limit to the reduction of the dislocation density (e.g., the edge dislocation density Ced).

However, for the condition at which the group V/group III ratio R (V/III) is low (e.g., about 330) as illustrated in FIG. 6A, the pit density Cp abruptly increases and the flatness markedly degrades. Therefore, the condition at which the group V/group III ratio R (V/III) is low generally is not employed. For example, when forming the foundation layer 60, the condition at which the group V/group III ratio R (V/III) is not less than about 2000 and not more than about 3000 is generally employed.

Generally, the condition at which the group V/group III ratio R (V/III) is low is abandoned because the pit density Cp is high, the flatness is poor, and voids and the like occur. Despite this, the inventor implemented the evaluations of the foundation layer 60 thus fabricated at conditions that are generally abandoned. Then, it was discovered that, as illustrated in FIG. 6A, the dislocation densities (both the screw dislocation density Csd and the edge dislocation density Ced) clearly decrease for the condition at which the group V/group III ratio R (V/III) is low.

Based on this newly-discovered phenomenon, the inventor investigated conditions to obtain a foundation layer 60 in which the dislocation density is low and the pit density Cp is low (i.e., the surface flatness is high). As a result, it was found that a semiconductor light emitting device that obtains a high efficiency can be obtained with both a low dislocation density and high surface flatness according to the configuration according to the embodiment.

In other words, in the first layer 64a of the formation of the foundation layer 60, the dislocations 65 are bent in the region not higher than the height of the substrate unevenness 51. The substrate unevenness 51 is filled with the second layer 64b that is formed subsequently to ensure the flatness. It is unnecessary to bend the dislocations 65 of the second layer 64b. Thereby, both high surface flatness and a lower dislocation density can be realized.

Figure 8A:
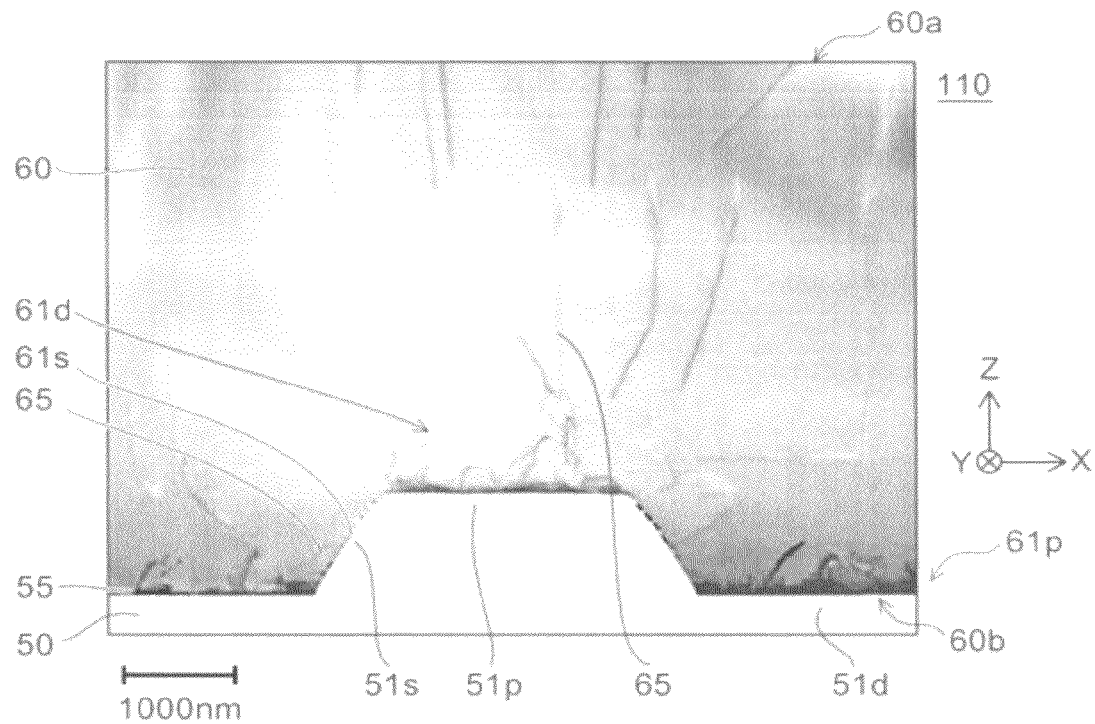
FIG. 8A and FIG. 8B are electron microscope photographs illustrating characteristics of the semiconductor light emitting devices.
Figure 8B:
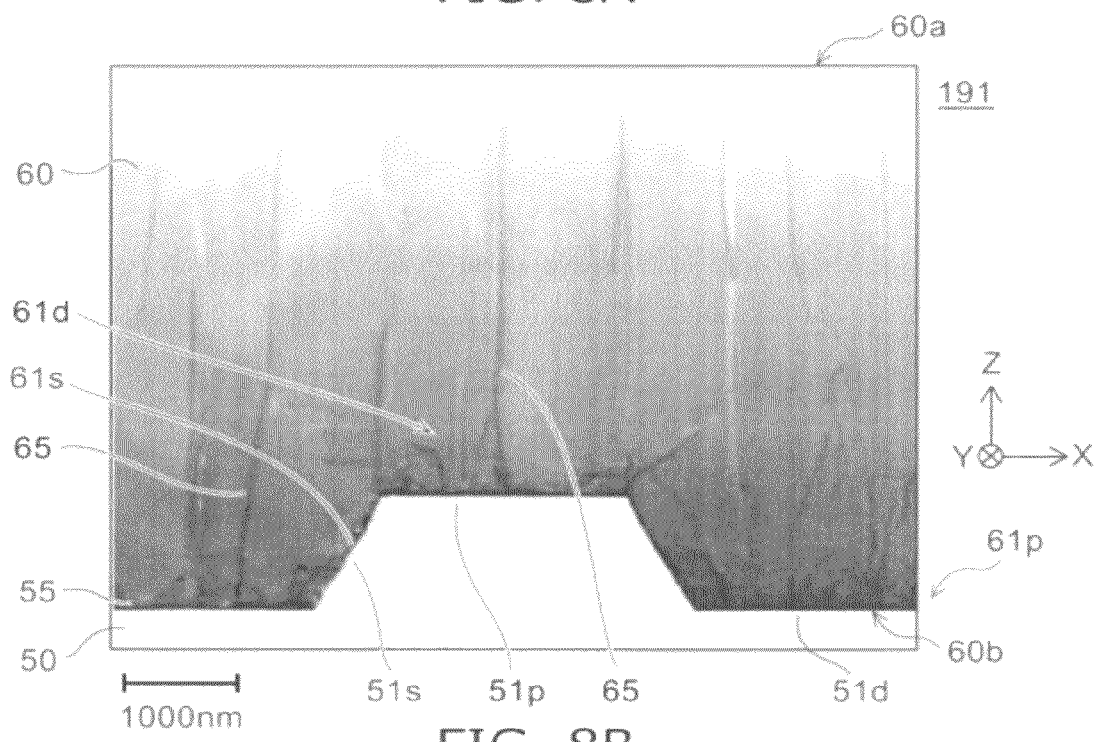

FIG. 8A and FIG. 8B are electron microscope photographs illustrating characteristics of the semiconductor light emitting devices.

These drawings illustrate cross section TEM images of the substrate 50 and the foundation layer 60 which are portions of the semiconductor light emitting devices. FIG. 8A corresponds to the semiconductor light emitting device 110 according to the embodiment. FIG. 8B corresponds to a semiconductor light emitting device 191 of a first reference example.

In the semiconductor light emitting device 110, the group V/group III ratio R (V/III) of the first layer 64a of the foundation layer 60 is 330. The group V/group III ratio R (V/III) of the second layer 64b is 1320.

On the other hand, in the semiconductor light emitting device 191, the foundation layer 60 was formed using one condition. Namely, in the formation of the foundation layer 60 of the semiconductor light emitting device 191, the group V/group III ratio R (V/III) was 1320. In other words, this corresponds to forming only the second layer 64b without forming the first layer 64a. The foundation layer 60 was formed at this condition on the buffer layer 55 on the substrate 50. The thickness of the foundation layer 60 was about 3 μm.

In FIG. 8A and FIG. 8B, the dark lines inside the images correspond to the dislocations 65.

It can be seen from FIG. 8A and FIG. 8B that the dislocations 65 reaching the first major surface 60a from the second major surface 60b of the foundation layer 60 are clearly fewer in the semiconductor light emitting device 110 than in the semiconductor light emitting device 191 of the first comparative example.

It can be seen from FIG. 8A that in the semiconductor light emitting device 110, the propagation directions of the dislocations 65 change in a region about 100 nm upward from the lower surface of the recess 61d and in the region about 100 nm upward from the lower surface of the protrusion 61p. The "lower surface" is the surface on the substrate 50 side; and "upward" is the direction from the substrate 50 toward the foundation layer 60. The change of the propagation directions of the dislocations 65 is the change from directions upward along the Z-axis to directions intersecting the Z-axis.

By changing the directions of the propagation of the dislocations 65, the dislocations 65 collide with each other; and the dislocations 65 extending upward are annihilated. Further, a portion of the dislocations 65 reaching the lower surface of the protrusion 61p (the dislocations 65 reaching the substrate recess 51d) also reach the side portion 61s (the substrate side portion 51s) and are annihilated. Therefore, the proportion of the number of the dislocations 65 reaching the protrusion 61p and reaching the first major surface 60a to the number of all of the dislocations 65 reaching the protrusion 61p is lower than the proportion of the number of the dislocations 65 reaching the recess 61d and reaching the first major surface 60a to the number of all of the dislocations 65 reaching the recess 61d.

Due to these phenomena, the dislocations 65 occurring at the surface of the foundation layer 60 (the second major surface 60b) that faces the substrate 50 decrease to ⅕ or less in a region of 500 nm from the second major surface 60b of the foundation layer 60.

In other words, in the semiconductor light emitting device 110, at least one of the dislocations 65 reaching the protrusion 61p also reaches the side portion 61s from the surface of the protrusion 61p on the second major surface 60b side in a region not more than 500 nm toward the first major surface 60a from the second major surface 60b.

The sum of the number of the dislocations 65 reaching the first major surface 60a and reaching the protrusions 61p included in the unit surface area of a plane perpendicular to the Z-axis and the number of the dislocations 65 reaching the first major surface 60a and reaching the recesses 61d included in the unit surface area is not more than ⅕ of the sum of the number of the dislocations 65 reaching the protrusion 61p included in the unit surface area and the number of the dislocations 65 reaching the recesses 61d included in the unit surface area. This is more desirably not more than ⅛.

On the other hand, in the semiconductor light emitting device 191 of the first reference example as illustrated in FIG. 8B, the greater part of the dislocations 65 reaching the recess 61d and the protrusion 61p propagate along the Z-axis and reach the first major surface 60a of the foundation layer 60. Then, the proportion of the number of the dislocations 65 reaching the protrusion 61p and reaching the first major surface 60a to the number of all of the dislocations 65 reaching the protrusion 61p is about the same as the proportion of the number of the dislocations 65 reaching the recess 61d and reaching the first major surface 60a to the number of all of the dislocations 65 reaching the recess 61d. At the first major surface 60a, pits formed due to the dislocations 65; and the surface flatness was poor.

Figure 9A:
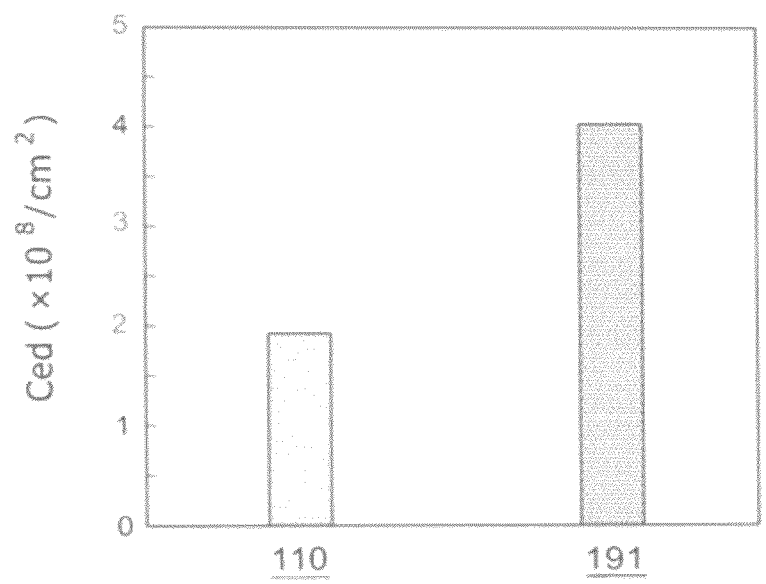
FIG. 9A and FIG. 9B are graphs illustrating characteristics of the semiconductor light emitting device.
Figure 9B:
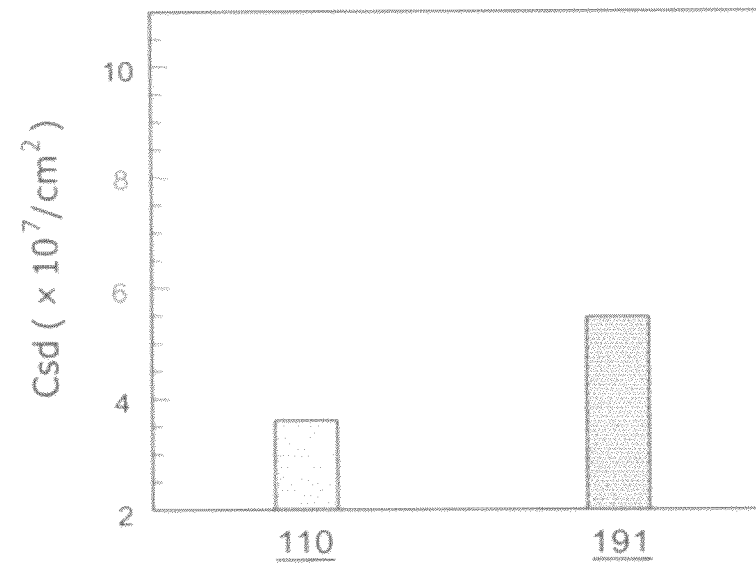

FIG. 9A and FIG. 9B are graphs illustrating characteristics of the semiconductor light emitting device.

Namely, these drawings illustrate measurement results of the dislocation density of the semiconductor light emitting device 110 and the semiconductor light emitting device 191. FIG. 9A illustrates the edge dislocation density Ced; and FIG. 9B illustrates the screw dislocation density Csd.

As illustrated in FIG. 9A and FIG. 9B, the edge dislocation density Ced and the screw dislocation density Csd of the semiconductor light emitting device 110 are lower than those of the semiconductor light emitting device 191. For example, while the edge dislocation density Ced of the semiconductor light emitting device 191 is about $4.1 \times 10^8 / cm^2$, the edge dislocation density Ced of the semiconductor light emitting device 110 is reduced by half to be about $2.0 \times 10^8 / cm^2$. While the screw dislocation density Csd of the semiconductor light emitting device 191 is about $5.6 \times 10^7 / cm^2$, the edge dislocation density Ced of the semiconductor light emitting device 110 is drastically reduced to about $3.6 \times 10^7 / cm^2$.

Figure 10:
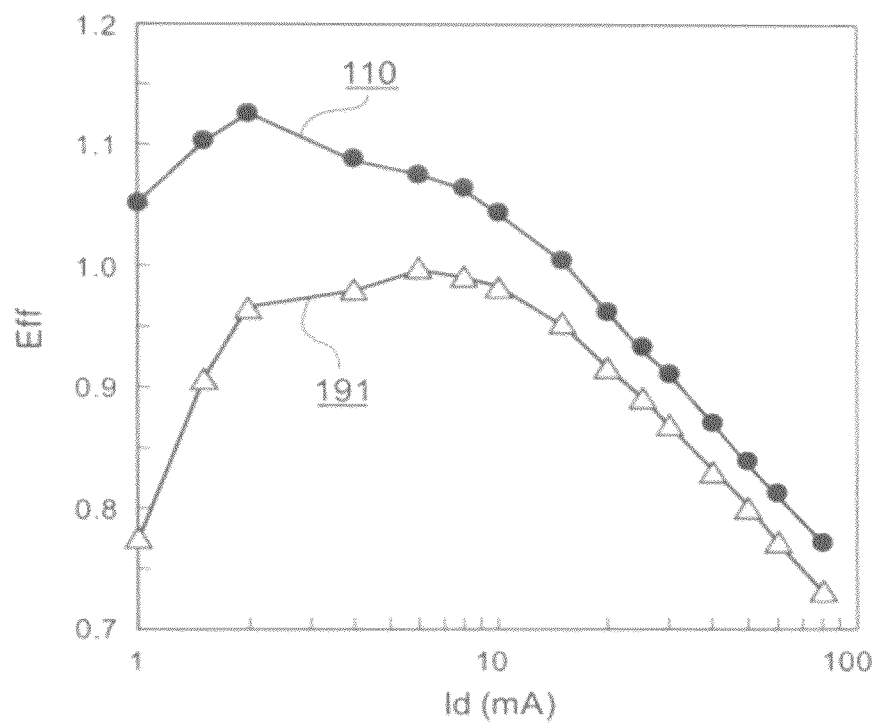
FIG. 10 is a graph illustrating characteristics of the semiconductor light emitting device.

FIG. 10 is a graph illustrating characteristics of the semiconductor light emitting device.

Namely, this graph illustrates the measurement results of the light emission characteristics of the semiconductor light emitting devices 110 and 191. The horizontal axis is a drive current Id; and the vertical axis is a luminous efficiency Eff (a relative value).

As illustrated in FIG. 10, the luminous efficiency Eff of the semiconductor light emitting device 110 is higher than the luminous efficiency Eff of the semiconductor light emitting device 191. In particular, the luminous efficiency Eff of the semiconductor light emitting device 110 greatly increases in the low current region. This is because in the semiconductor light emitting device 110, the density of the dislocations, which are non-radiative recombination centers, is low and more carriers contribute to the radiative recombination.

Thus, according to the semiconductor light emitting device 110 according to the embodiment, a nitride semiconductor light emitting device having high efficiency is obtained with both a low dislocation density and high surface flatness.

Although the case is described above for the foundation layer 60 according to the embodiment where the temperature of the formation is the same for the first layer 64a and the second layer 64b, the embodiment is not limited thereto. For example, results similar to those recited above were obtained also in the case where the formation temperature of the first layer 64a was 1060° C. and the formation temperature of the second layer 64b was 1120° C. For example, results similar to those recited above were obtained also in the case where the pressure inside the reaction chamber during the formation of the first layer 64a was 1013 hPa and the pressure inside the reaction chamber during the formation of the second layer 64b was 400 hPa.

In the embodiment, it is favorable for the temperature of the formation of the second layer 64b to be not less than the temperature of the formation of the first layer 64a. Thereby, for example, it is easier to improve the fillability and obtain high surface flatness.

In the embodiment, it is favorable for the pressure inside the reaction chamber during the formation of the second layer 64b to be not more than the pressure inside the reaction chamber during the formation of the first layer 64a. Thereby, for example, it is easier to improve the fillability and obtain high surface flatness.

In the embodiment, it is favorable for the thickness of the foundation layer 60 to be not less than 1 μm and not more than 4 μm. By the thickness of the foundation layer 60 being not less than 1 μm and not more than 4 μm, it is easier to have good fillability of the substrate unevenness 51 and obtain a flat foundation layer 60.

FIG. 11A to FIG. 11D are schematic views illustrating the configuration of a semiconductor light emitting device of a second reference example.

Figure 11A:
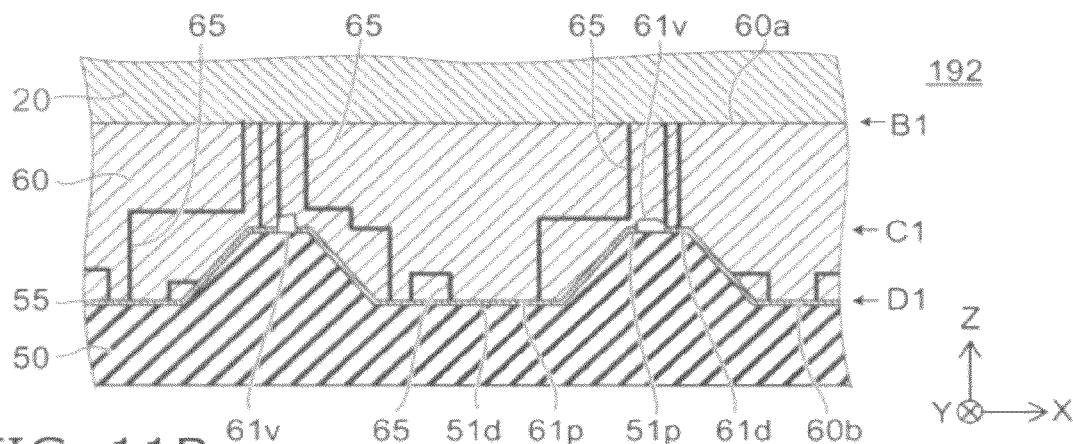
FIG. 11A to FIG. 11D are schematic views illustrating a semiconductor light emitting device of a second reference example.
Figure 11B:
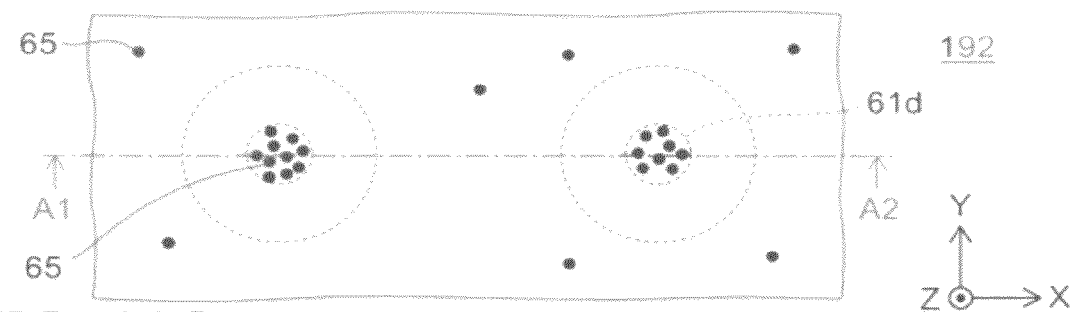
Figure 11C:
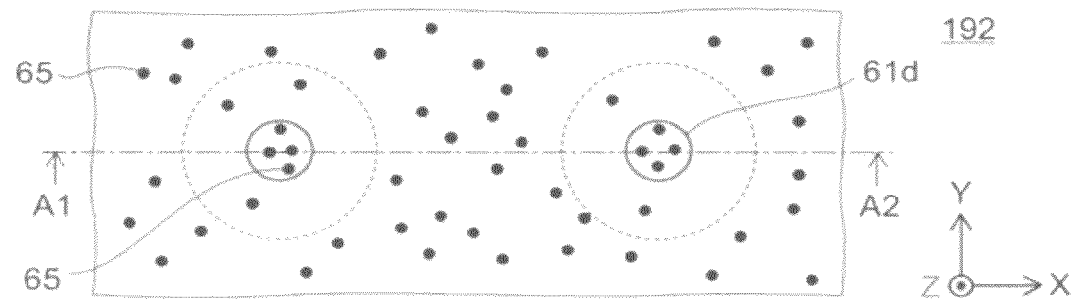
Figure 11D:
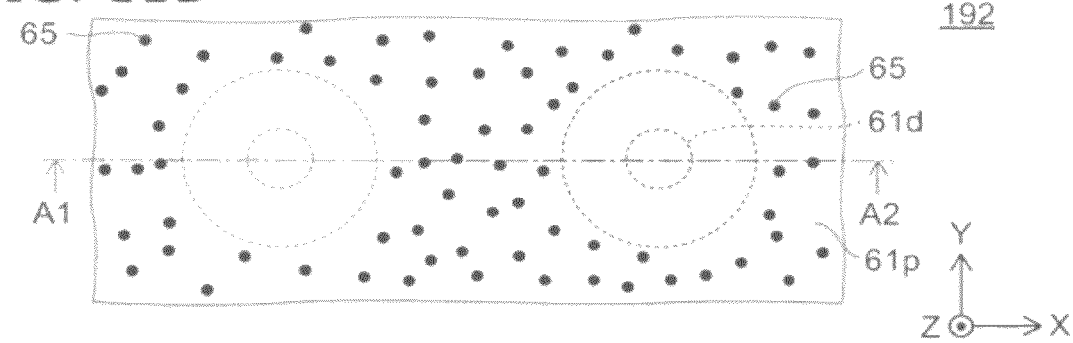

FIG. 11A is a cross-sectional view along line A1-A2 of FIG. 11B to FIG. 11D. FIG. 11B, FIG. 11C, and FIG. 11D are plan views of the B1 plane, the C1 plane, and the D1 plane of FIG. 11A, respectively.

In the semiconductor light emitting device 192 of the second reference example, the foundation layer 60 is formed using one condition. The group V/group III ratio R (V/III) of this formation is low, e.g., 330. In other words, this corresponds to the entire foundation layer 60 of the semiconductor light emitting device 192 being formed using only the formation condition of the first layer 64a of the semiconductor light emitting device 110. The semiconductor light emitting device 192 corresponds to the case where the group V/group III ratio R (V/III) illustrated in FIG. 6A and FIG. 6B is, for example, 330.

In the semiconductor light emitting device 192 as illustrated in FIG. 11A, voids 60v form in the foundation layer 60. Further, although a portion of the dislocations 65 reaching the protrusion 61p also reaches the side portion 61s, many of the dislocations 65 reaching the protrusion 61p reach the first major surface 60a.

In the semiconductor light emitting device 192, the extension directions of the dislocations 65 change to directions reaching the Z-axis direction (e.g., orthogonal directions) in a region not lower than the height of the substrate protrusion 51p. Therefore, a portion of the dislocations 65 occurring at the substrate recess 51d reaches the first major surface 60a above the substrate protrusion 51p.

Therefore, as illustrated in FIG. 11B and FIG. 11C, the number of the dislocations 65 reaching the region of the first major surface 60a overlaying the recess 61d when viewed along the Z-axis direction is greater than the number of the dislocations 65 reaching the recess 61d.

As illustrated in FIG. 11D, the characteristics of the dislocations 65 of the second major surface 60b of the semiconductor light emitting device 192 are similar to those of the semiconductor light emitting device 110.

Thus, in the semiconductor light emitting device 192 of the second reference example, the voids 60v occur because the formation of the foundation layer 60 is performed only using a low group V/group III ratio R (V/III). Then, as illustrated in FIG. 6B, the pit density Cp is high. Further, the degree of the decrease of the dislocations 65 is low because a portion of the dislocations 65 occurring at the substrate recess 51d reaches the first major surface 60a above the substrate protrusion 51p.

In contrast, in the semiconductor light emitting device 110 according to the embodiment, the formation of the foundation layer 60 includes the formation of the first layer 64a using a low group V/group III ratio R (V/III) and the formation of the second layer 64b using a high group V/group III ratio R (V/III). Therefore, the occurrence of the voids 60v is suppressed. Also, the pit density Cp is low. Further, the extension directions of the dislocations 65 occurring at the substrate recess 51d change to directions reaching the Z-axis direction in the region not higher than the height of the substrate protrusion 51p to be annihilated by reaching each other or reaching the side portion 61s. Therefore, the degree of the decrease of the dislocations 65 is high.

Figure 12A:
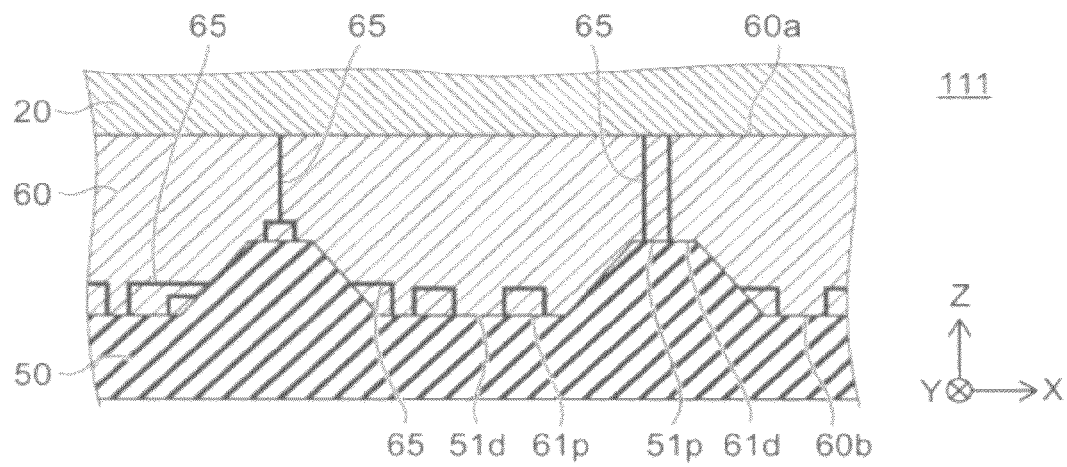
FIG. 12A and FIG. 12B are schematic cross-sectional views illustrating other semiconductor light emitting devices according to the first embodiment.
Figure 12B:
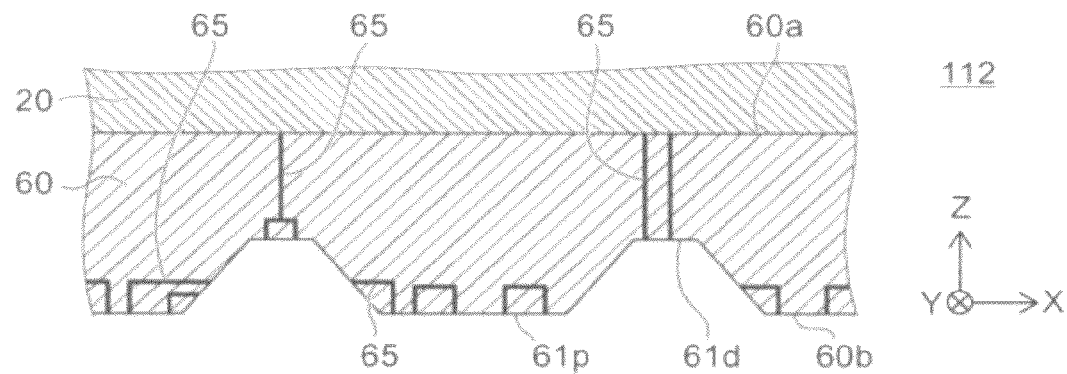

FIG. 12A and FIG. 12B are schematic cross-sectional views illustrating the configurations of other semiconductor light emitting devices according to the first embodiment.

As illustrated in FIG. 12A, the buffer layer 55 is not provided in a semiconductor light emitting device 111 according to the embodiment. Or, the buffer layer 55 is thin; and the substrate 50 substantially contacts the foundation layer 60. In such a case as well, if the foundation layer 60 has the configuration recited above, a nitride semiconductor light emitting device having high efficiency can be provided with both a low dislocation density and high surface flatness.

In a semiconductor light emitting device 112 according to the embodiment as illustrated in FIG. 12B, the substrate 50 and the buffer layer 55 are not provided. This configuration is obtained, for example, by forming the stacked structural body 10s including the foundation layer 60 on the substrate 50 (on the buffer layer 55) and subsequently removing the substrate 50 (and the buffer layer 55). In such a case as well, if the foundation layer 60 has the configuration recited above, a nitride semiconductor light emitting device having high efficiency can be provided with both a low dislocation density and high surface flatness.

In the case where the substrate 50 is removed, it is favorable to use Si, which can be chemically etched using a solution, as the substrate 50 because the foundation layer 60 can be removed without being damaged and the processes are easy.

SECOND EMBODIMENT

The embodiment relates to a nitride semiconductor layer.

Figure 13A:
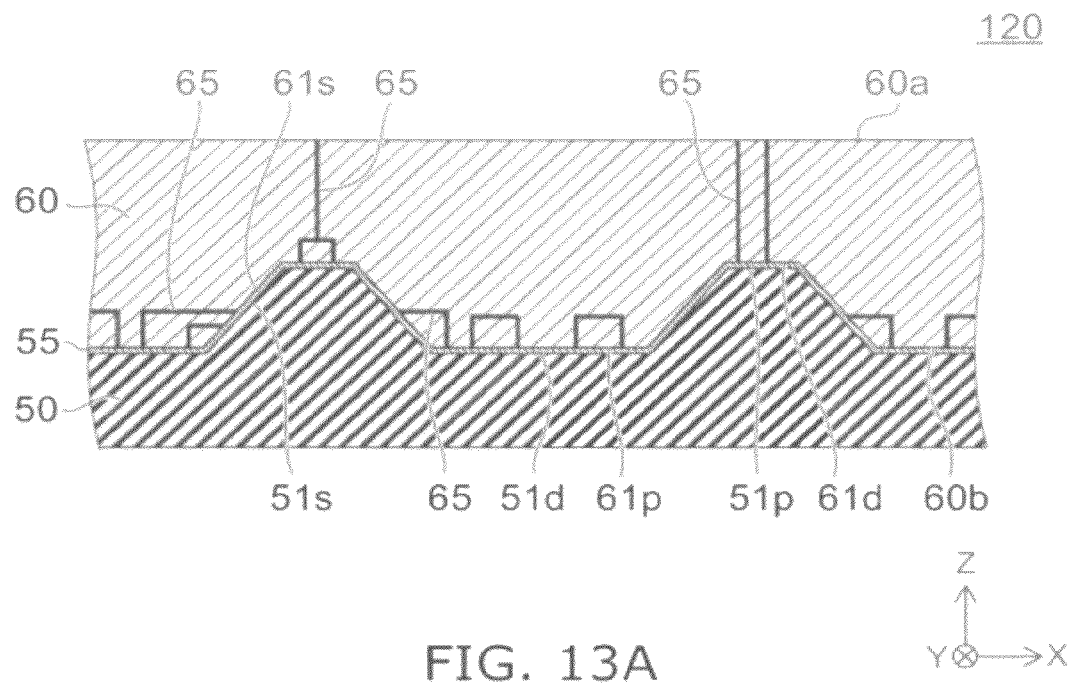
FIG. 13A and FIG. 13B are schematic cross-sectional views illustrating nitride semiconductor layers according to a second embodiment.
Figure 13B:
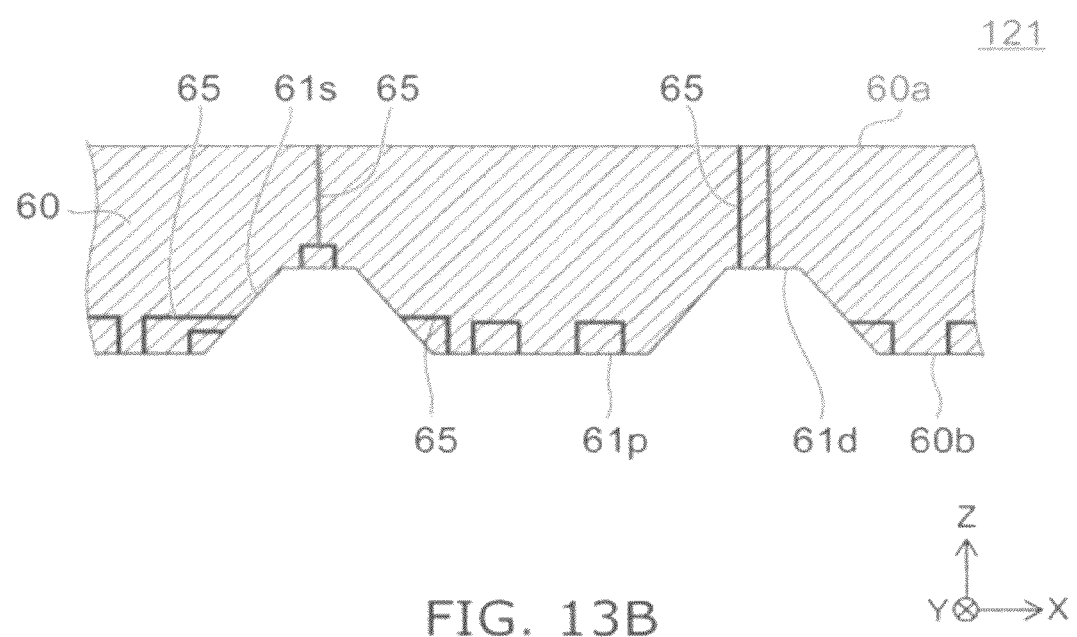

FIG. 13A and FIG. 13B are schematic cross-sectional views illustrating the configurations of nitride semiconductor layers according to the second embodiment.

As illustrated in FIG. 13A, a nitride semiconductor layer 120 according to the embodiment (e.g., the foundation layer 60) includes the first major surface 60a and the second major surface 60b. The second major surface 60b is the major surface on the side opposite to the first major surface 60a.

The nitride semiconductor layer 120 further includes the unevenness 61 provided in the second major surface 60b.

At least one of the dislocations 65 reaching the protrusion 61p of the unevenness 61 reaches the side portion 61s of the unevenness 61 and does not reach the first major surface 60a.

The proportion of the number of the dislocations 65 reaching the protrusion 61p and reaching the first major surface 60a to the number of all of the dislocations 65 reaching the protrusion 61p is lower than the proportion of the number of the dislocations 65 reaching the recess 61d of the unevenness 61 and reaching the first major surface 60a to the number of all of the dislocations 65 reaching the recess 61d.

The number of the dislocations 65 reaching the region of the first major surface 60a overlaying the recess 61d when viewed along the stacking direction (e.g., the Z-axis direction) from the second major surface 60b toward the first major surface 60a is less than the number of the dislocations 65 reaching the recess 61d.

The nitride semiconductor layer 120 is provided on, for example, the substrate 50. That is, the nitride semiconductor layer 120 is formed on the substrate 50. The substrate 50 has the substrate unevenness 51 which faces the unevenness 61 of the nitride semiconductor layer 120. The nitride semiconductor layer 120 may function as, for example, the foundation layer of the second semiconductor layer 20, the light emitting layer 30, and the first semiconductor layer 10 of the semiconductor light emitting device. Or, the nitride semiconductor layer 120 may be used as, for example, at least a portion of a semiconductor layer included in a semiconductor light emitting device. Or, the nitride semiconductor layer 120 may be applied to a semiconductor device using a nitride semiconductor layer such as a transistor (e.g., a HEMT) and the like.

The nitride semiconductor layer 120 according to the embodiment may include the first layer 64a and the second layer 64b described in regard to the first embodiment. The method for manufacturing the nitride semiconductor layer 120 may include at least a portion of the manufacturing method described in regard to the first embodiment.

In a nitride semiconductor layer 121 (e.g., the foundation layer 60) according to the embodiment as illustrated in FIG. 13B, the substrate 50 and the buffer layer 55 are not provided. This configuration is obtained by, for example, forming the foundation layer 60 on the substrate 50 (on the buffer layer 55) and by subsequently removing the substrate 50 (and the buffer layer 55). In such a case as well, if the foundation layer 60 has the configuration recited above, a nitride semiconductor layer can be provided with both a low dislocation density and high surface flatness. The nitride semiconductor layer 121 also may be applied to a semiconductor light emitting device such as an LED and the like and a semiconductor device using a nitride semiconductor layer such as a transistor (e.g., a HEMT) and the like.

THIRD EMBODIMENT

The embodiment relates to a method for forming a nitride semiconductor layer.

Figure 14:
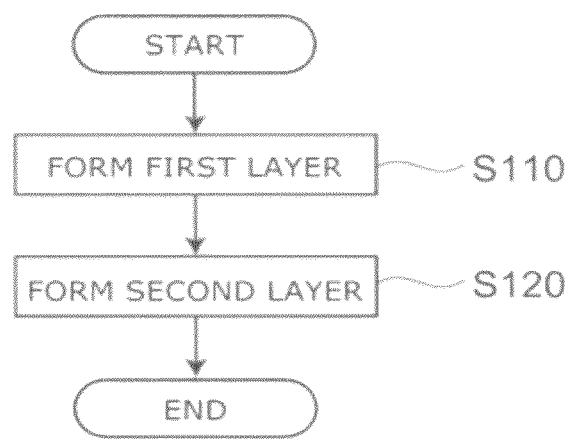
FIG. 14 is a flowchart illustrating a method for forming a nitride semiconductor layer according to a third embodiment.
Figure 15A:
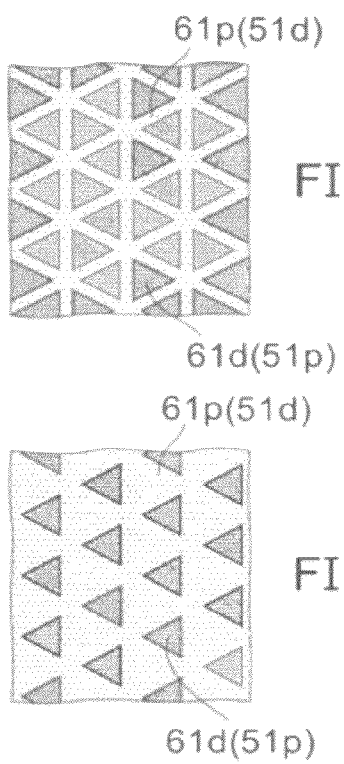
FIG. 15A to FIG. 15H and FIG. 16A to FIG. 16H are schematic plan views illustrating semiconductor light emitting devices and methods for forming the nitride semiconductor layers according to the embodiment.
Figure 15B:
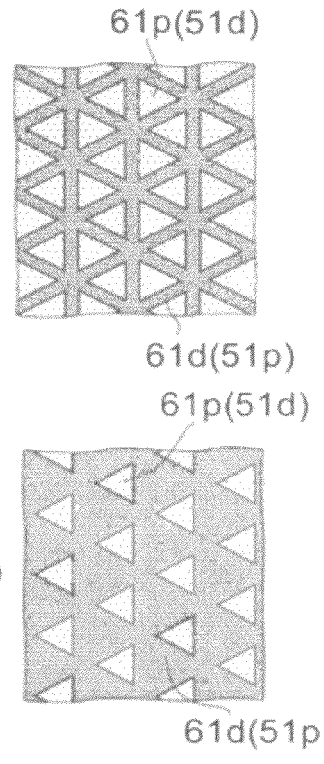
Figure 15C:
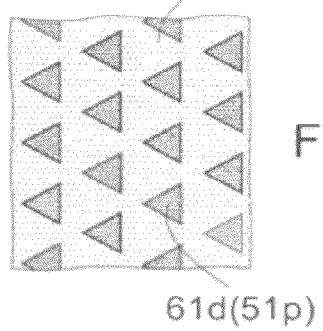
Figure 15D:
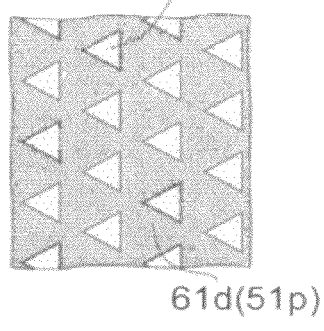
Figure 15E:
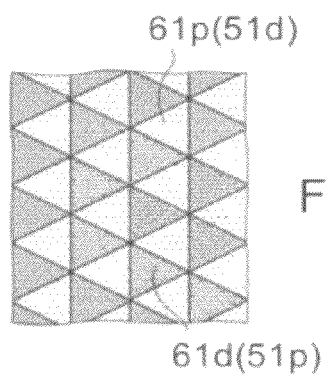
Figure 15F:
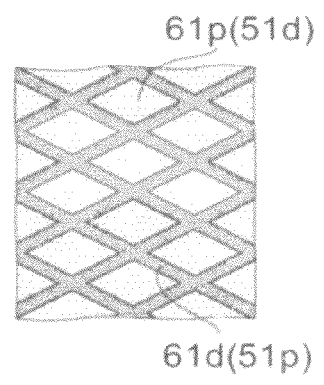
Figure 15G:
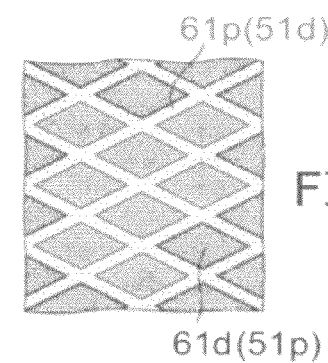
Figure 15H:
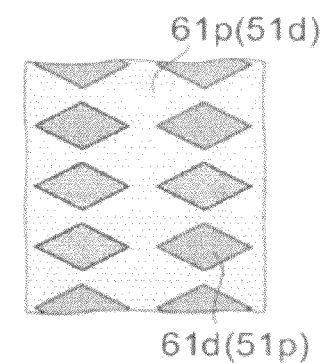
Figure 16A:
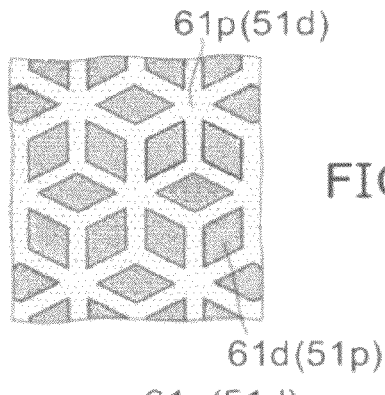
Figure 16B:
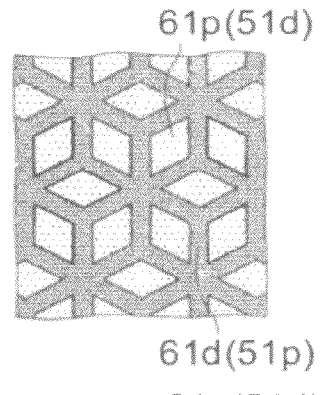
Figure 16C:
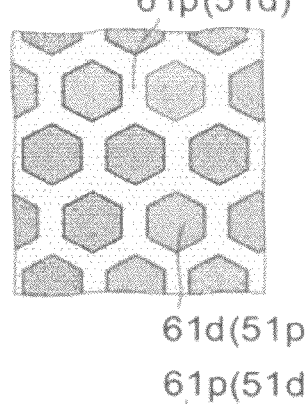
Figure 16D:
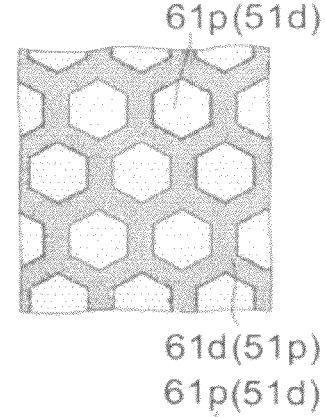
Figure 16E:
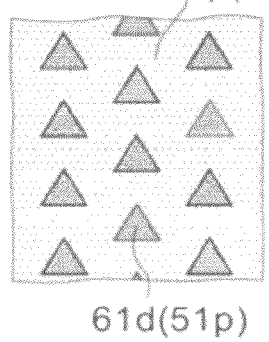
Figure 16F:
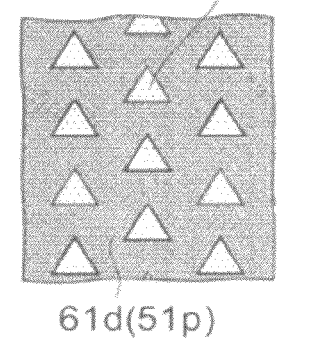
Figure 16G:
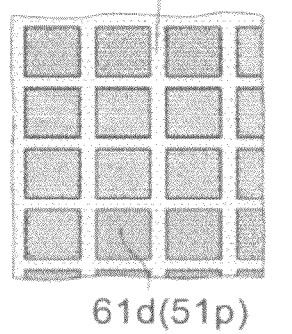
Figure 16H:
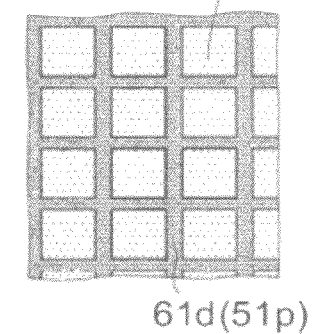

FIG. 14 is a flowchart illustrating the method for forming the nitride semiconductor layer according to the third embodiment.

As illustrated in FIG. 14, the method for forming the nitride semiconductor layer according to the embodiment includes a first process (step S110) and a second process (step S120).

The first process includes forming the first layer 64a that includes a nitride semiconductor on the major surface of the substrate 50 in which the substrate protrusion 51p, the substrate recess 51d, and the substrate side portion 51s are provided by using a group III source material and a group V source material.

The substrate protrusion 51p is a portion of the major surface of the substrate 50 that protrudes relatively more than does the substrate recess 51d. The substrate recess 51d is a portion that recedes relatively more than does the substrate protrusion 51p. The substrate side portion 51s is a portion between the substrate protrusion 51p and the substrate recess 51d.

The substrate protrusion 51p is, for example, the portion from the most protruding portion of the major surface of the substrate 50 to the position of 10% of the height h51 of the substrate protrusion 51p from the most protruding portion. The substrate recess 51d is, for example, the portion from the most receding portion of the major surface to the position of 10% of the height h51 (the depth) from the most receding portion. The substrate side portion 51s is, for example, the portion of the major surface other than the substrate protrusion 51p and the substrate recess 51d (the portion of 80% of the height h61).

The second process includes forming the second layer 64b that includes the nitride semiconductor on the first layer 64a using the group III source material and the group V source material.

The proportion of the supply amount of the group V source material to the supply amount of the group III source material (the group V/group III ratio R (V/III)) of the first process is lower than the proportion of the supply amount of the group V source material to the supply amount of the group III source material (the group V/group III ratio R (V/III)) of the second process.

The first process includes at least one of the dislocations 65 occurring from the substrate recess 51d in the first layer 64a also reaching the substrate side portion 51s. The second process includes filling the unevenness, which is formed in the surface of the first layer 64a, with the second layer 64b to planarize the second layer 64b.

Thereby, a method for forming a nitride semiconductor layer having high efficiency can be provided with both a low dislocation density and high surface flatness.

The degree of the decrease of the dislocation density of the second process is lower than the degree of the decrease of the dislocation density of the first process.

In the embodiment, the first process includes causing the dislocations 65 occurring from the substrate recess 51d to reach the substrate side portion 51s in the region of the first layer 64a having a thickness from the substrate recess 51d not more than 500 nm. The thickness of the first layer 64a may be less than 500 nm.

In the embodiment, it is favorable for the group V/group III ratio R (V/III) of the first process to be less than 660 and not less than 200. Thereby, for example, the reduction effect of the dislocation density is obtained more easily.

In the embodiment, it is favorable for the group V/group III ratio R (V/III) of the second process to be not less than 660. Thereby, for example, the pit density Cp can be reduced more stably and a higher surface flatness is easily obtained.

The embodiment may be applied to not only the method for forming the nitride semiconductor layer but also the method for manufacturing any semiconductor device (including, e.g., a semiconductor light emitting device) using a nitride semiconductor layer.

There exists a method for forming a nitride semiconductor layer on the substrate 50 having the substrate unevenness 51 by forming a crystal unit having a facet surface and subsequently forming a flat film by promoting the lateral-direction growth while bending the dislocation lines in lateral directions (a third reference example). In such a case, the directions of the dislocations 65 change at positions higher than the height h51 of the substrate protrusion 51p. Therefore, the dislocations 65 do not reach the substrate side portion 51s. Therefore, in the third reference example, the reduction effect of the dislocation density is insufficient.

Also, there exists a method in which a crystal is grown from the substrate protrusion 51p without growing a crystal from the substrate recess 51d and by causing the crystals grown from the substrate protrusion 51p to combine above the substrate recess 51d (a fourth reference example). In such a case as well, the reduction effect of the dislocation density is insufficient because the dislocations 65 do not reach the substrate side portion 51s.

There exists a method in which a group III nitride semiconductor is formed on the substrate 50 having the substrate unevenness 51 using the condition of the group V/group III ratio R (V/III) being not less than 0 and not more than 100 (a fifth reference example). In such a case, the group III nitride semiconductor that is formed is metal-rich and substantially is a Ga layer or an Al layer. In such a case, voids occur easily; the pit density Cp increases; and a nitride semiconductor layer having good characteristics is not obtained. In contrast, in the embodiment, the group V/group III ratio R (V/III) is set to be not less than 200. Thereby, the metal content ratio is appropriate; and a nitride semiconductor layer having good characteristics is obtained.

Although there exists a method in which a material that is different from the substrate 50 is used to form an unevenness on the substrate 50 and a nitride semiconductor layer is formed on the unevenness (a sixth reference example), the manufacturing is complex in such a case. In contrast, in the embodiment, the productivity is high because the substrate unevenness 51 is formed in the substrate 50 itself without using another material.

In the case where multiple substrate protrusions 51p are provided in the substrate 50 in the embodiment, it is favorable for the multiple substrate protrusions 51p to be disposed two-dimensionally in a plane perpendicular to the Z-axis. In the case where multiple substrate recesses 51d are provided in the substrate 50, it is favorable for the multiple substrate recesses 51d to be disposed two-dimensionally in the plane perpendicular to the Z-axis. Thereby, the dislocations 65 occurring from the substrate recess 51d easily reach the substrate side portion 51s when extending in the plane; and the reduction effect of the dislocation density increases.

In the case where multiple recesses 61d are provided in the foundation layer 60, it is favorable for the multiple recesses 61d to be disposed two-dimensionally in a plane perpendicular to the Z-axis.

In the case where multiple protrusions 61p are provided in the foundation layer 60, it is favorable for the multiple protrusions 61p to be disposed two-dimensionally in a plane perpendicular to the Z-axis. Thereby, the dislocations 65 occurring from the protrusion 61p easily reach the side portion 61s when extending in the plane; and the reduction effect of the dislocation density increases.

In other words, it is favorable for at least one selected from the protrusion 61p and the recess 61d to be multiply provided in the foundation layer 60 and disposed two-dimensionally in a plane perpendicular to the Z-axis direction.

FIG. 15H to FIG. 15H and FIG. 16A to FIG. 16H are schematic plan views illustrating the configurations of semiconductor light emitting devices and methods for forming the nitride semiconductor layers according to the embodiment.

Namely, these drawings illustrate the planar configurations and the planar dispositions (the configurations and the dispositions when viewed along the Z-axis) of the unevenness 61 (the recess 61d and the protrusion 61p) and the substrate unevenness 51 (the substrate protrusion 51p and the substrate recess 51d) of the foundation layer 60.

As illustrated in FIG. 15A to FIG. 15H and FIG. 16A to FIG. 16H, the substrate protrusion 51p and the substrate recess 51d may have various configurations such as triangles, quadrilaterals (including diamonds and parallelograms), hexagons, and the like. The multiply-provided substrate protrusions 51p and the multiply-provided substrate recesses 51d may be disposed at the vertexes of the triangles, the centers and the vertexes of the hexagons, and the like. Other than those recited above, various modifications of the planar dispositions of the unevenness 61 and the substrate unevenness 51 are possible in the embodiment.

According to the embodiment, a semiconductor light emitting device, a nitride semiconductor layer, and a method for forming a nitride semiconductor layer having high efficiency can be provided with both a low dislocation density and high surface flatness.

In the specification, "nitride semiconductor" includes all compositions of semiconductors of the chemical formula $B_x In_y Al_z Ga_{1-x-y-z}N$ ($0 \leq x \leq 1$, $0 \leq y \leq 1$, $0 \leq z \leq 1$, and $x+y+z \leq 1$) for which the compositional proportions x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the invention is not limited to these specific examples. For example, one skilled in the art may similarly practice the invention by appropriately selecting specific configurations of components included in semiconductor light emitting devices such as foundation layers, semiconductor layers, light emitting layers, electrodes, substrates, buffer layers, and the like from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all semiconductor light emitting devices, nitride semiconductor layers, and methods for forming nitride semiconductor layers practicable by an appropriate design modification by one skilled in the art based on the semiconductor light emitting devices, the nitride semiconductor layers, and the methods for forming nitride semiconductor layers described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
   a foundation layer having a first major surface and a second major surface on a side opposite to the first major surface, the foundation layer including a nitride semiconductor;
   a first semiconductor layer of a first conductivity type including a nitride semiconductor, the first semiconductor layer being stacked with the foundation layer along a stacking direction;
   a light emitting layer provided between the foundation layer and the first semiconductor layer, the light emitting layer including a nitride semiconductor; and
   a second semiconductor layer of a second conductivity type provided between the foundation layer and the light emitting layer, the second conductivity type being different from the first conductivity type, the second semiconductor layer including a nitride semiconductor,
   the first major surface facing the second semiconductor layer,
   the foundation layer having an unevenness provided on the second major surface, the unevenness having a recess, a side portion, and a protrusion,
   the first major surface having an overlay-region which overlays the recess when viewed along the stacking direction,
   the foundation layer having a plurality of dislocations, the dislocations including first dislocations whose one ends reaching the recess and second dislocations whose one ends reaching the protrusion,
   an another end of at least one of the second dislocations reaching the side portion without reaching the first major surface,
   a proportion of a number of the second dislocations reaching the first major surface to a number of all of the second dislocations being smaller than a proportion of a number of the first dislocations reaching the first major surface to a number of all of the first dislocations, and
   a number of the dislocations reaching the overlay-region of the first major surface being smaller than a number of all of the first dislocations.

2. The device according to claim 1, wherein a sum of a number of the dislocations which reach the first major surface with one ends thereof, and reach the protrusion with another ends thereof included in a unit surface area of a plane perpendicular to the stacking direction, and a number of the dislocations which reach the first major surface with one ends thereof, and reach the recess with another ends thereof included in the unit surface area is not more than $\frac{1}{5}$ of a sum of a number of the dislocations which reach the protrusion included in the unit surface area and a number of the dislocations which reach the recess included in the unit surface area.

3. The device according to claim 1, wherein the at least one of the dislocations whose one ends reach the protrusion reaches the side portion in a region within 500 nanometers toward the first major surface from a surface of the protrusion.

4. The device according to claim 1, wherein a thickness of the foundation layer is not less than 1 micrometer and not more than 4 micrometers.

5. The device according to claim 1, wherein at least one of the protrusion and the recess is multiply provided, and the plurality of the at least one is disposed two-dimensionally in a plane perpendicular to the stacking direction.

6. The device according to claim 1, wherein an impurity concentration in the foundation layer is lower than an impurity concentration in the first semiconductor layer and is lower than an impurity concentration in the second semiconductor layer.

7. The device according to claim 1, wherein the first conductivity type is a p-type, and the second conductivity type is an n-type.

8. The device according to claim 1, wherein
the first semiconductor layer includes a p-type GaN layer, and
the second semiconductor layer includes an n-type GaN layer.

9. The device according to claim 1, wherein the foundation layer is an undoped GaN layer.

10. The device according to claim 1, wherein a height of the unevenness is not less than 500 nanometers and not more than 3 micrometers.

11. The device according to claim 1, wherein the unevenness is formed with a periodicity of not less than 500 nanometers and not more than 3 micrometers.

12. The device according to claim 1, further comprising a substrate, the foundation layer being disposed between the substrate and the second semiconductor layer, the substrate having a substrate unevenness facing the unevenness of the foundation layer.

13. A nitride semiconductor layer, having a first major surface, a second major surface on a side opposite to the first major surface, and an unevenness provided on the second major surface,
at least one of dislocations which reach a protrusion of the unevenness with one end thereof reaching a side portion of the unevenness with another end thereof without reaching the first major surface,
a proportion of a number of dislocations which reach the first major surface with one ends thereof and reach the protrusion with another ends thereof to a number of all of the dislocations which reach the protrusion being smaller than a proportion of a number of dislocations which reach the first major surface with one ends thereof and reach a recess of the unevenness to a number of all of the dislocations which reach the recess, and
a number of the dislocations which reach a region of the first major surface overlaying the recess when viewed along a stacking direction from the second major surface toward the first major surface being smaller than a number of the dislocations which reach the recess.

14. The nitride semiconductor layer according to claim 13, wherein a sum of a number of the dislocations which reach the first major surface with one ends thereof, and reach the protrusion with another ends thereof included in a unit surface area of a plane perpendicular to the stacking direction, and a number of the dislocations which reach the first major surface with one ends thereof, and reach the recess with another ends thereof included in the unit surface area is not more than ⅕ of a sum of a number of the dislocations which reach the protrusion included in the unit surface area and a number of the dislocations which reach the recess included in the unit surface area.

15. The nitride semiconductor layer according to claim 13, wherein the at least one of the dislocations whose one ends reach the protrusion reaches the side portion in a region within 500 nanometers toward the first major surface from a surface of the protrusion.

16. The nitride semiconductor layer according to claim 13, wherein a thickness of the nitride semiconductor layer is not less than 1 micrometer and not more than 4 micrometers.

17. The nitride semiconductor layer according to claim 13, wherein at least one of the protrusion and the recess is multiply provided, and the plurality of the at least one is disposed two-dimensionally in a plane perpendicular to the stacking direction.

18. The nitride semiconductor layer according to claim 13, wherein the nitride semiconductor layer is formed on a substrate and the substrate has a substrate unevenness which faces the unevenness of the nitride semiconductor layer.

* * * * *